(12) United States Patent
Riley et al.

(10) Patent No.: US 6,856,849 B2
(45) Date of Patent: Feb. 15, 2005

(54) METHOD FOR ADJUSTING RAPID THERMAL PROCESSING (RTP) RECIPE SETPOINTS BASED ON WAFER ELECTRICAL TEST (WET) PARAMETERS

(75) Inventors: Terrence J. Riley, Austin, TX (US); William Jarrett Campbell, Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 771 days.

(21) Appl. No.: 09/731,579

(22) Filed: Dec. 6, 2000

(65) Prior Publication Data

US 2002/0095278 A1 Jul. 18, 2002

(51) Int. Cl.[7] .............................................. G08F 19/00
(52) U.S. Cl. ............................ 700/121; 374/5; 703/2; 703/13
(58) Field of Search ............................. 374/5; 700/121; 703/13, 2

(56) References Cited

U.S. PATENT DOCUMENTS

| | | | | |
|---|---|---|---|---|
| 4,891,499 A | * | 1/1990 | Moslehi | 219/502 |
| 5,029,117 A | * | 7/1991 | Patton | 702/135 |
| 5,226,732 A | * | 7/1993 | Nakos et al. | 374/133 |
| 5,410,162 A | * | 4/1995 | Tigelaar et al. | 257/48 |
| 5,719,796 A | * | 2/1998 | Chen | 703/13 |
| 5,761,481 A | * | 6/1998 | Kadoch et al. | 703/2 |
| 5,848,842 A | | 12/1998 | Peuse et al. | 374/1 |
| 5,991,699 A | | 11/1999 | Kulkarni et al. | 702/83 |
| 6,028,994 A | | 2/2000 | Peng et al. | 395/500.36 |
| 6,055,460 A | | 4/2000 | Shopbell | 700/121 |
| 6,184,048 B1 | * | 2/2001 | Ramon | 438/14 |
| 6,289,257 B1 | * | 9/2001 | Sekine | 700/121 |
| 6,337,218 B1 | * | 1/2002 | Uzoh et al. | 438/14 |

OTHER PUBLICATIONS

Poogyeon et al., "Control Strategy for Temperature Tracking in Rapid Thermal Processing of Semiconductor Wafers", Proceedings of the 31st Conference on Decision and Control; pp. 2568–2573.*
Stuber et al., "Model–based Control of Rapid Thermal Processes", Proceedings of the 33rd Conference on Decision and Control; pp. 79–85.*
Dilhac et al., "Thermal Modeling of a Wafer in a Rapid Thermal Processor", IEEE Transactions on Semiconductor Manufacturing; vol. 8, No. 4, Nov. 1995, 432–439.*
Gyugyi et al., "Control of Rapid Thermal Processing: A System Theoretic Approach", IEEE Transactions on Control Systems Technology; vol. 5, No. 6, Nov. 1997, 644–653.*
International Search Report dated Oct. 1, 2002 for International application no. PCT/US01/44112 Filed Nov. 6, 2001.
Potts, D.C.: "Manufacturing for Design: Putting Process Control in the Language of the Designer," Advanced Semiconductor Manufacturing Conference and Workshop, 1998. 1998 IEEE/Semi Boston, MA, USA Sep. 23–25, 1998, New York, NY, USA, IEEE, US pp. 187–189 XP010314134 ISBN: 0–7803–4380–8.

* cited by examiner

Primary Examiner—Leo Picard
Assistant Examiner—Carlos Ortiz-Rodriguez
(74) Attorney, Agent, or Firm—Williams, Morgan & Amerson, P.C.

(57) ABSTRACT

A method is provided, the method comprising measuring at least one parameter characteristic of processing performed on a workpiece in a processing step, and modeling the at least one characteristic parameter measured using a correlation model. The method also comprises applying the correlation model to modify the processing performed in the processing step.

35 Claims, 13 Drawing Sheets

METHOD FOR ADJUSTING RAPID THERMAL PROCESSING (RTP) RECIPE SETPOINTS BASED ON WAFER ELECTRICAL TEST (WET) PARAMETERS

BACKGROUND OF THE INVENTION

1. Field of the Invention

This invention relates generally to semiconductor fabrication technology, and, more particularly, to a method for semiconductor fabrication supervision and optimization.

2. Description of the Related Art

There is a constant drive within the semiconductor industry to increase the quality, reliability and throughput of integrated circuit devices, e.g., microprocessors, memory devices, and the like. This drive is fueled by consumer demands for higher quality computers and electronic devices that operate more reliably. These demands have resulted in a continual improvement in the manufacture of semiconductor devices, e.g., transistors, as well as in the manufacture of integrated circuit devices incorporating such transistors. Additionally, reducing defects in the manufacture of the components of a typical transistor also lowers the overall cost per transistor as well as the cost of integrated circuit devices incorporating such transistors.

The technologies underlying semiconductor processing tools have attracted increased attention over the last several years, resulting in substantial refinements. However, despite the advances made in this area, many of the processing tools that are currently commercially available suffer certain deficiencies. In particular, such tools often lack advanced process data monitoring capabilities, such as the ability to provide historical parametric data in a user-friendly format, as well as event logging, real-time graphical display of both current processing parameters and the processing parameters of the entire run, and remote, i.e., local site and worldwide, monitoring. These deficiencies can engender nonoptimal control of critical processing parameters, such as throughput accuracy, stability and repeatability, processing temperatures, mechanical tool parameters, and the like. This variability manifests itself as within-run disparities, run-to-run disparities and tool-to-tool disparities that can propagate into deviations in product quality and performance, whereas an ideal monitoring and diagnostics system for such tools would provide a means of monitoring this variability, as well as providing means for optimizing control of critical parameters.

Among the parameters it would be useful to monitor and control are critical dimensions (CDs) and doping levels for transistors (and other semiconductor devices), as well as overlay errors in photolithography. CDs are the smallest feature sizes that particular processing devices may be capable of producing. For example, the minimum widths w of polycrystalline (polysilicon or poly) gate lines for metal oxide semiconductor field effect transistors (MOSFETs or MOS transistors) may correspond to one CD for a semiconductor device having such transistors. Similarly, the junction depth $d_j$ (depth below the surface of a doped substrate to the bottom of a heavily doped source/drain region formed within the doped substrate) may be another CD for a semiconductor device such as an MOS transistor. Doping levels may depend on dosages of ions implanted into the semiconductor devices, the dosages typically being given in numbers of ions per square centimeter at ion implant energies typically given in keV.

However, traditional statistical process control (SPC) techniques are often inadequate to control precisely CDs and doping levels in semiconductor and microelectronic device manufacturing so as to optimize device performance and yield. Typically, SPC techniques set a target value, and a spread about the target value, for the CDs, doping levels, and/or overlay errors in photolithography. The SPC techniques then attempt to minimize the deviation from the target value without automatically adjusting and adapting the respective target values to optimize the semiconductor device performance, as measured by wafer electrical test (WET) measurement characteristics, for example, and/or to optimize the semiconductor device yield and throughput. Furthermore, blindly minimizing non-adaptive processing spreads about target values may not increase processing yield and throughput.

Traditional control techniques are frequently ineffective in reducing off-target processing and in improving sort yields. For example, the wafer electrical test (WET) measurements are typically not performed on processed wafers until quite a long time after the wafers have been processed, sometimes not until weeks later. When one or more of the processing steps are producing resulting wafers that wafer electrical test (WET) measurements indicate are unacceptable, causing the resulting wafers to be scrapped, this misprocessing goes undetected and uncorrected for quite a while, often for weeks, leading to many scrapped wafers, much wasted material and decreased overall throughput. Furthermore, data sets for making correlations between processing and/or tool trace data, on the one hand, and testing data, such as wafer electrical test (WET) measurements, on the other, are typically manually extracted by the process engineers and put together, a very time-consuming procedure.

The present invention is directed to overcoming, or at least reducing the effects of, one or more of the problems set forth above.

SUMMARY OF THE INVENTION

In one aspect of the present invention, a method is provided, the method comprising measuring at least one parameter characteristic of processing performed on a workpiece in a processing step, and modeling the at least one characteristic parameter measured using a correlation model. The method also comprises applying the correlation model to modify the processing performed in the processing step.

In another aspect of the present invention, a computer-readable, program storage device is provided, encoded with instructions that, when executed by a computer, perform a method, the method comprising measuring at least one parameter characteristic of processing performed on a workpiece in a processing step, and modeling the at least one characteristic parameter measured using a correlation model. The method also comprises applying the correlation model to modify the processing performed in the processing step.

In yet another aspect of the present invention, a computer programmed to perform a method is provided, the method comprising measuring at least one parameter characteristic of processing performed on a workpiece in a processing step, and modeling the at least one characteristic parameter measured using a correlation model. The method also comprises applying the correlation model to modify the processing performed in the processing step.

BRIEF DESCRIPTION OF THE DRAWINGS

The invention may be understood by reference to the following description taken in conjunction with the accompanying drawings, in which the leftmost significant digit(s) in the reference numerals denote(s) the first figure in which the respective reference numerals appear, and in which:

FIGS. 1, 3–4, and 6–10 schematically illustrate a flow chart for various illustrative embodiments of a method according to the present invention;

FIG. 2 schematically illustrates in cross-section an AST SHS 2800 rapid thermal anneal (RTA) tool representative of those used in various illustrative embodiments of the present invention;

FIG. 5 schematically illustrates a metal-oxide-semiconductor (MOS) transistor representative of transistors tested in various embodiments of a method according to the present invention;

FIG. 11 schematically illustrates a method for fabricating a semiconductor device practiced in accordance with the present invention;

FIG. 12 schematically illustrates workpieces being processed using a Rapid Thermal Processing (RTP) tool, using a plurality of control input signals, in accordance with the present invention;

FIGS. 13–14 schematically illustrate one particular embodiment of the process and tool in FIG. 12; and FIG. 15 schematically illustrates one particular embodiment of the method of FIG. 11 as may be practiced with the process and tool of FIGS. 13–14.

Figure 1:
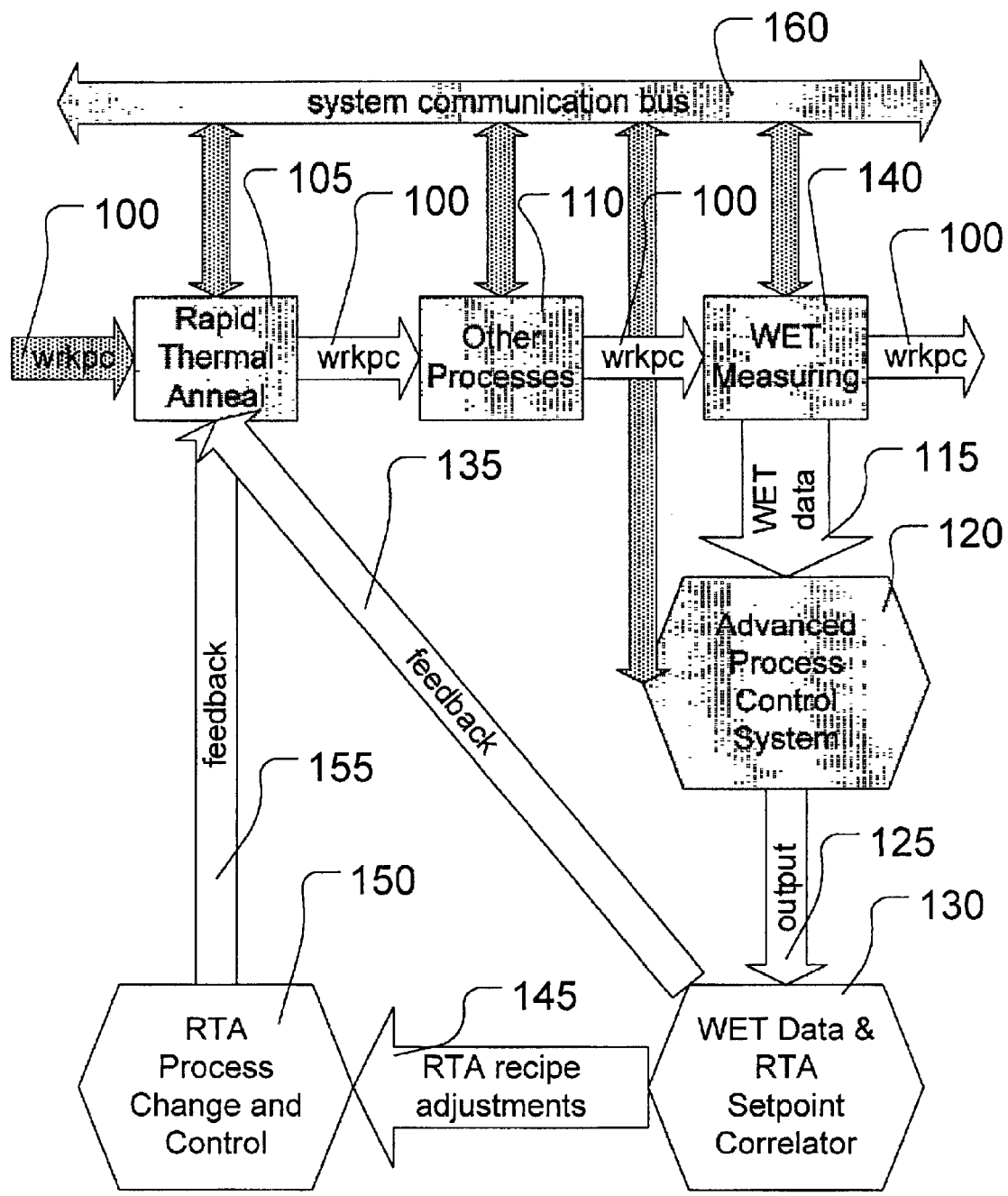
FIGS. 1–15 schematically illustrate various embodiments of a method for manufacturing according to the present invention; and, more particularly.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Illustrative embodiments of a method according to the present invention are shown in FIGS. 1–15. As shown in FIG. 1, a workpiece 100, such as a semiconducting substrate or wafer, having one or more process layers and/or semiconductor devices such as a metal-oxide-semiconductor (MOS) transistor disposed thereon, for example, is delivered to a rapid thermal processing step 105, where a rapid thermal anneal may be performed on the workpiece 100. As shown in FIG. 1, the rapid thermal processing step 105 may communicate with other processing steps 110 and with a final Wafer Electrical Test (WET) measurement step 140 via a system communications bus 160. As shown in FIG. 1, the system communications bus 160 also provides communications between the rapid thermal processing step 105, the other processing steps 110 and the final Wafer Electrical Test (WET) measurement step 140, and an Advanced Process Control (APC) system 120, more fully described below.

Figure 2:
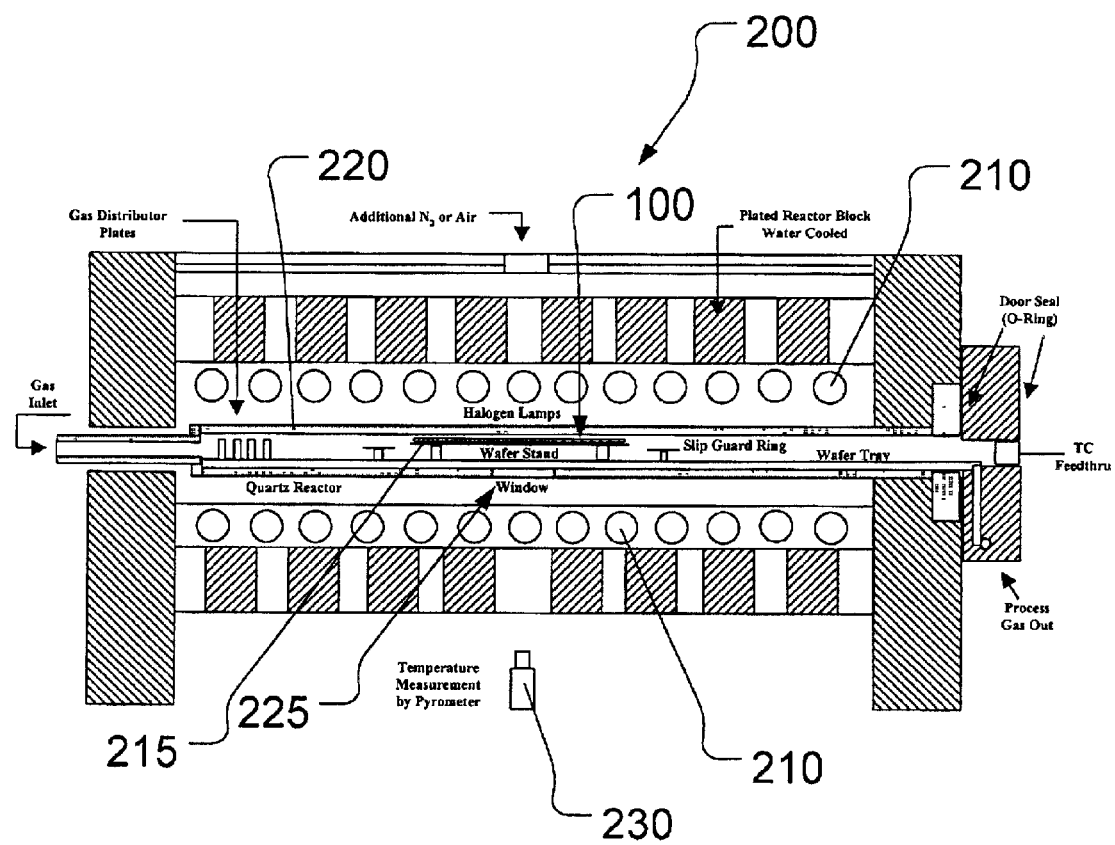

FIG. 2 schematically illustrates in cross-section an AST SHS 2800 rapid thermal anneal (RTA) tool 200 that may be used in the rapid thermal processing step 105 in various illustrative embodiments according to the present invention. Various alternative illustrative embodiments of the present invention may use rapid thermal anneal (RTA) tools (such as the Centura® RTP) manufactured by Applied Materials (AMAT), which are quite different in physical form, usage, and measured parameters, but which may, nevertheless, be used in the rapid thermal processing step 105.

As shown in FIG. 2, the rapid thermal anneal (RTA) tool 200 may heat a workpiece 100, such as a semiconducting silicon wafer with zero, one, or more process layers formed thereon, by using an array of halogen lamps 210 disposed above and below the workpiece 100. The workpiece 100 may be disposed on quartz pins and a wafer stand 215, which may include other components, such as an AST Hot Liner™, within a quartz tube 220 heated by the array of halogen lamps 210. The temperature of the quartz tube 220 may be measured by a thermocouple and/or a pyrometer 230 that measures the temperature of the AST Hot Liner™ component of the wafer stand 215 and/or a separate pyrometer (not shown). The quartz tube 220 may have a quartz window 225 disposed therein below the wafer stand 215. The temperature of the AST Hot Liner™ component of the wafer stand 215, and, indirectly, the workpiece 100 may be measured through the quartz window 225 by the pyrometer 230 disposed below the quartz window 225. Alternatively, the pyrometer 230 disposed below the quartz window 225 may directly measure the temperature of the workpiece 100. The lamp power of the halogen lamps 210 may also be monitored and controlled.

Figure 3:
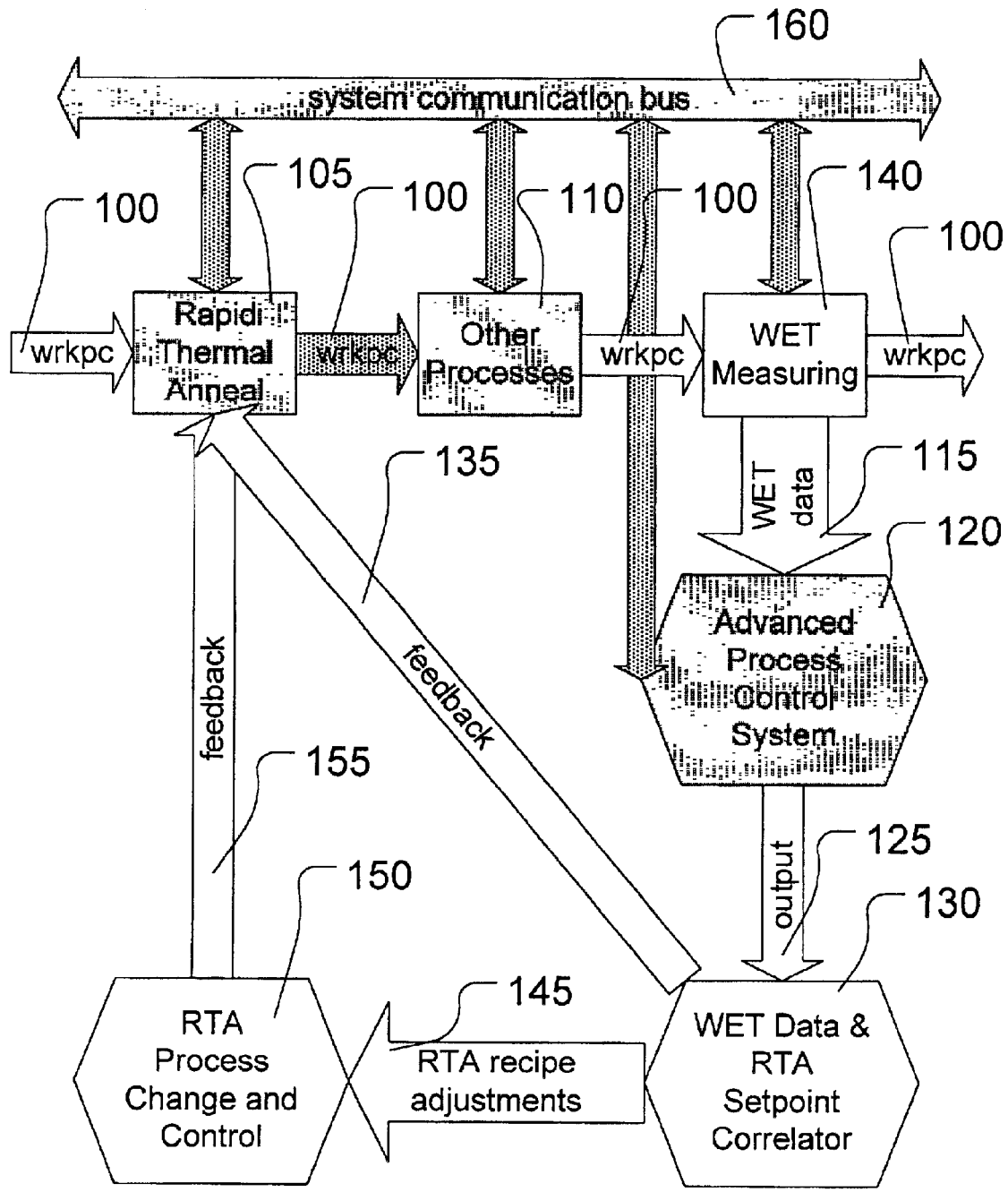

As shown in FIG. 3, the workpiece 100 is sent from the rapid thermal processing step 105 and delivered to the other processing steps 110. In the other processing steps 110, other processing is performed on the workpiece 100 to result in the finished workpiece 100. As shown in FIG. 3, the other processing steps 110 may communicate with the rapid thermal processing step 105 via the system communications bus 160. As shown in FIG. 3, the system communications bus 160 also provides communications between the rapid thermal processing step 105, the other processing steps 110, and the Advanced Process Control (APC) system 120, more fully described below.

Figure 4:
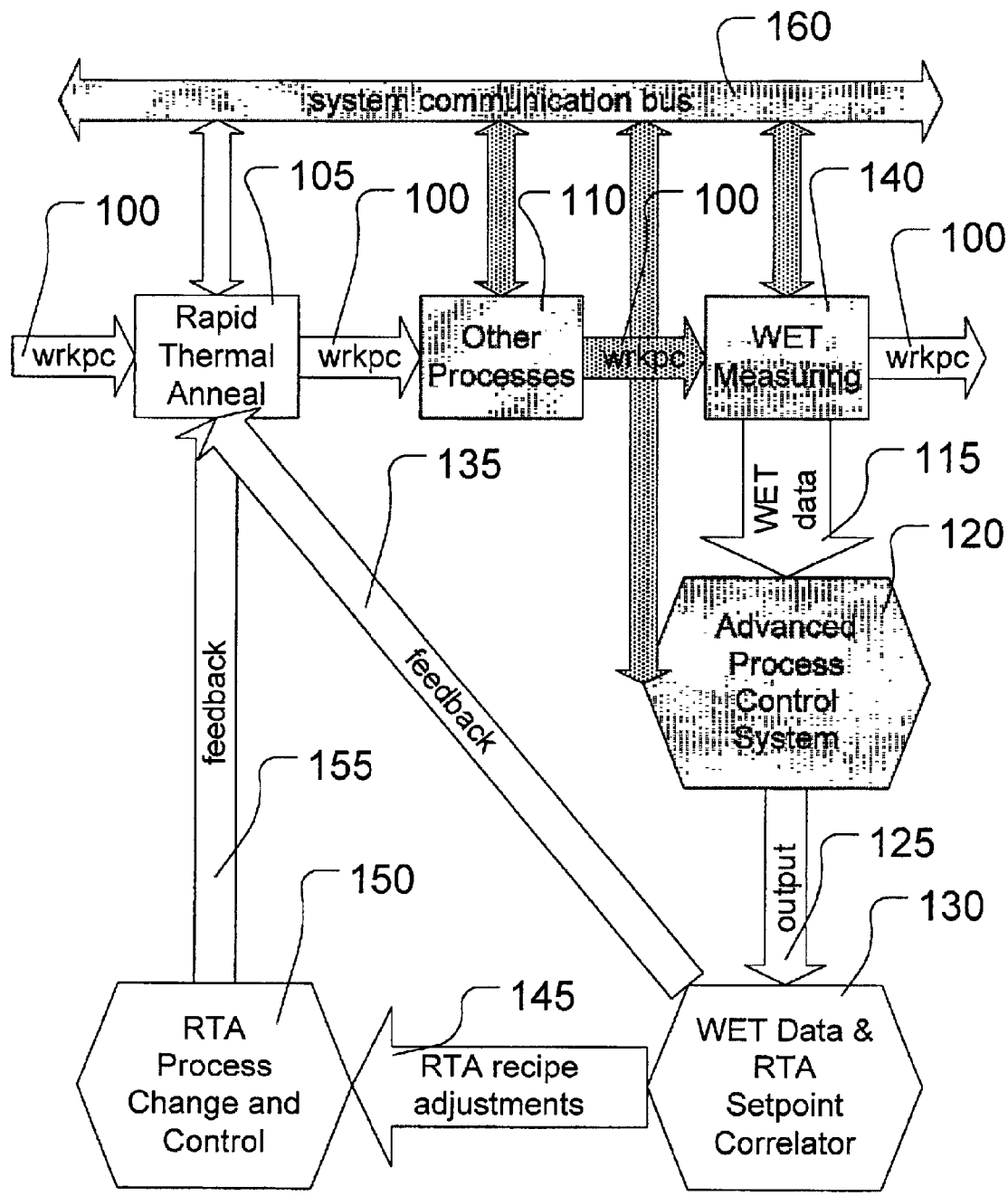

As shown in FIG. 4, the workpiece 100 is sent from the other processing steps 110 and delivered to the final Wafer Electrical Test (WET) measurement step 140. As shown in FIG. 4, the final Wafer Electrical Test (WET) measurement step 140 may communicate with the other processing steps 110 via the system communications bus 160. As shown in FIG. 4, the system communications bus 160 also provides communications between the other processing steps 110, the final Wafer Electrical Test (WET) measurement step 140, and the Advanced Process Control (APC) system 120, more fully described below.

The wafer electrical test (WET) of the semiconductor device and/or devices and/or process layers formed on the workpiece 100 performed in the final Wafer Electrical Test (WET) measurement step 140 may measure current and/or voltage responses of metal-oxide-semiconductor (MOS)

transistors formed on the workpiece 100, for example, and/or capacitances and/or resistances of elements of metal-oxide-semiconductor (MOS) transistors formed on the workpiece 100. For example, the saturation drain-source current $I_{dsat}$ of metal-oxide-semiconductor (MOS) transistors formed on the workpiece 100 may be measured as an indicator of how fast the metal-oxide-semiconductor (MOS) transistors formed on the workpiece 100 may be switched from "on" to "off" states.

Figure 5:
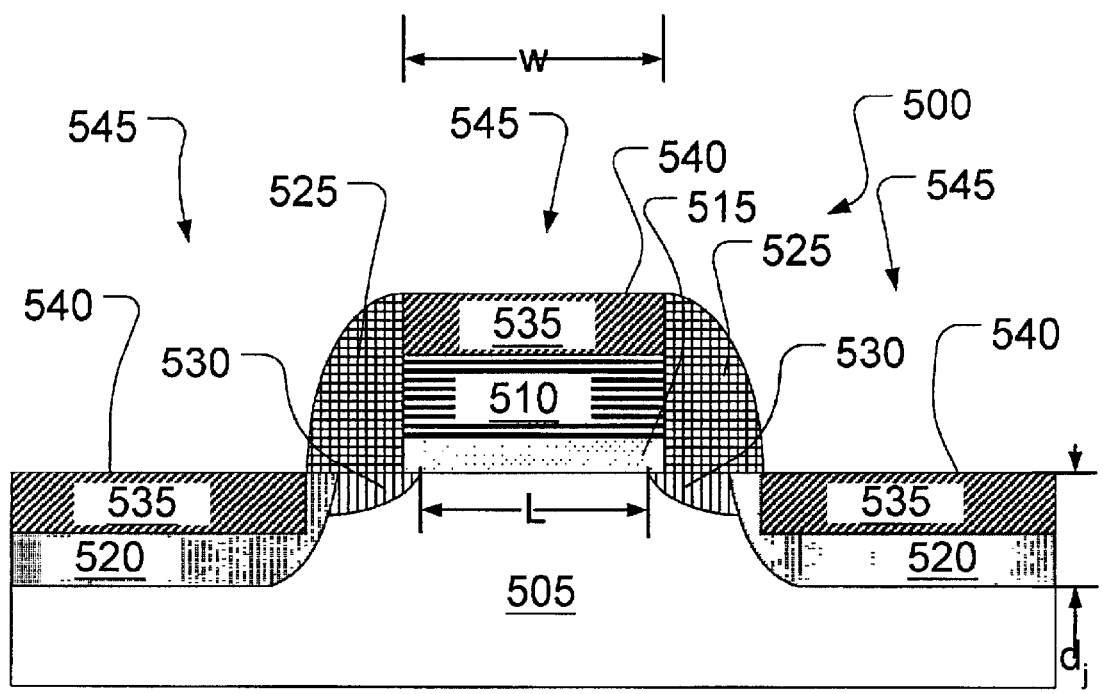

As shown in FIG. 5, a metal-oxide-semiconductor field effect transistor (MOSFET or MOS transistor) 500 may be formed on a semiconducting substrate 505, such as doped-silicon. The metal-oxide-semiconductor (MOS) transistor 500 may have a doped-poly gate 510 formed above a gate oxide 515 formed above the semiconducting substrate 505. The doped-poly gate 510 and the gate oxide 515 may be separated from $N^+$-doped ($P^+$-doped) source/drain regions 520 of the metal-oxide-semiconductor (MOS) transistor 500 by dielectric spacers 525. The dielectric spacers 525 may be formed above $N^-$-doped ($P^-$-doped) lightly doped drain (LDD) regions 530.

The $N^-$-doped ($P^-$-doped) LDD regions 530 are typically provided to reduce the magnitude of the maximum channel electric field found close to the $N^+$-doped ($P^+$-doped) source/drain regions 520 of the metal-oxide-semiconductor (MOS) transistor 500, and, thereby, to reduce the associated hot-carrier effects. The lower (or lighter) doping of the $N^-$-doped ($P^-$-doped) LDD regions 530, relative to the $N^+$-doped ($P^+$-doped) source/drain regions 520 of the metal-oxide-semiconductor (MOS) transistor 500, reduces the magnitude of the maximum channel electric field found close to the $N^+$-doped ($P^+$-doped) source/drain regions 520 of the metal-oxide-semiconductor (MOS) transistor 500, but increases the source-to-drain resistances of the $N^-$-doped ($P^-$-doped) LDD regions 530.

A titanium (Ti) metal layer (not shown; cobalt and/or other metals may be used in various alternative illustrative embodiments) may have been blanket-deposited on the metal-oxide-semiconductor (MOS) transistor 500 and then subjected to an initial rapid thermal anneal (RTA) process performed at a temperature ranging from approximately 450–800° C. for a time ranging from approximately 15–60 seconds. At surfaces 540 of active areas 545, such as the $N^+$-doped ($P^+$-doped) source/drain regions 520 and the doped-poly gate 510, exposed Si reacts upon heating with the Ti metal to form a titanium silicide ($TiSi_2$) layer 535 the surfaces 540 of the active areas 545. The Ti metal is not believed to react with the dielectric spacers 525 upon heating. A wet chemical strip of the Ti metal removes excess, unreacted portions (not shown) of the Ti metal layer 235, leaving behind the self-aligned silicided (salicided) $TiSi_2$ layer 535 only at and below the surfaces 540 of the active areas 545. The salicided $TiSi_2$ 535 may then be subjected to a final RTA process performed at a temperature ranging from approximately 800–1000° C. for a time ranging from approximately 10–60 seconds.

As shown in FIG. 5, the metal-oxide-semiconductor (MOS) transistor 500 may be specified by several processing parameters. For example, the doped-poly gate 510 may have a width w that, in turn, determines a channel length L. The channel length L is the distance between the two metallurgical $N^-$-$P$ ($P^-$-$N$) junctions formed below the gate oxide 515 for an N-MOS (P-MOS) transistor 500, the two metallurgical $N^-$-$P$ ($P^-$-$N$) junctions being between the $N^-$-doped ($P^-$-doped) LDD regions 530 and the semiconducting substrate 505. Further, another junction (having a junction depth $d_j$) below the $N^+$-doped ($P^+$-doped) source/drain regions 520 may be formed between the $N^+$-doped ($P^+$-doped) source/drain regions 520 and the semiconducting substrate 505. The semiconducting substrate 505 may have a doping level $N_D$ ($N_A$) reflecting the density of donor (acceptor) impurities typically being given in numbers of ions per square centimeter for an N-type (P-type) semiconducting substrate 505. In addition, the $N^+$-doped ($P^+$-doped) source/drain regions 520 and the $N^-$-doped ($P^-$-doped) LDD regions 530 may each have respective doping levels $N_{D+}$ and $N_{D-}$ ($N_{A+}$ and $N_{A-}$). The respective doping levels may depend on dosages of ions implanted into the $N^+$-doped ($P^+$-doped) source/drain regions 520 and the $N^-$-doped ($P^-$-doped) LDD regions 530, the dosages typically being given in numbers of ions per square centimeter at ion implant energies typically given in keV. Further, the gate oxide 515 may have a thickness $t_{ox}$.

The wafer electrical test (WET) of the semiconductor device and/or devices and/or process layers formed on the workpiece 100 that are performed in the final Wafer Electrical Test (WET) measurement step 140 may measure current and/or voltage responses of the metal-oxide-semiconductor (MOS) transistors 500 formed on the workpiece 100, for example, and/or capacitances and/or resistances of elements of the metal-oxide-semiconductor (MOS) transistors 500 formed on the workpiece 100. For example, the saturation drain-source current $I_{dsat}$ of metal-oxide-semiconductor (MOS) transistors 500 formed on the workpiece 100 may be measured as an indicator of how fast the metal-oxide-semiconductor (MOS) transistors 500 formed on the workpiece 100 may be switched from "on" to "off" states. Similarly, the wafer electrical test (WET) of the metal-oxide-semiconductor (MOS) transistors 500 formed on the workpiece 100 may measure the drain-source current $I_D$ at different values of the drain voltage $V_D$, gate voltage $V_G$ and/or substrate voltage (or bias) $V_{BS}$. By measuring change in the drain-source current $I_D$ with change in the drain voltage $V_D$, at constant gate voltage $V_G$, the channel conductance $g_D$ may be determined from $$g_D = \frac{\partial I_D}{\partial V_D}\bigg|_{V_G=\text{const}} = \frac{Z}{L}\mu_n C_i(V_G - V_T),$$

where Z is the channel width (in the direction perpendicular to the plane of the MOS transistor 500 in FIG. 5), $\mu_n$ is the mobility of the electrons (related to the drift velocity $v_{ndrift}$ of the electrons by $v_{ndrift}=\mu_n E$, where $E=V_D/L$ is the electric field across the drain/source), $C_i$ is the capacitance per unit area ($C_i=\epsilon_{ox}/t_{ox}$, where $\epsilon_{ox}\approx 4$ is the dielectric constant for the gate oxide 515), and $V_T$ is the threshold voltage of the metal-oxide-semiconductor (MOS) transistor 500. Similarly, by measuring change in the drain-source current $I_D$ with change in the gate voltage $V_G$, at constant drain voltage $V_D$, the transconductance $g_m$ may be determined from $$g_m = \frac{\partial I_D}{\partial V_G}\bigg|_{V_G=\text{const}} = \frac{Z}{L}\mu_n C_i V_D.$$

Here, the linear region of drain-source current $I_D$ versus drain voltage $V_D$ is used, where $$I_D \approx \left(\frac{Z}{L}\right)\mu_n C_i(V_G - V_T)V_D, \quad \text{for } V_D \ll (V_G - V_T),$$

and the threshold voltage $V_T$ is given by $$V_T = 2\psi_B + \frac{\sqrt{2\varepsilon_s q N_A (2\psi_B)}}{C_i},$$

where $\psi_B$ is the potential difference between the Fermi level $E_F$ in the doped-poly gate 510 and the intrinsic (flat-band) Fermi level $E_{Fi}$ in the P-type semiconducting substrate 505, $\varepsilon_s$ is the dielectric constant for the P-type semiconducting substrate 505, q is the absolute value of the electric charge on an electron (q=1.60218×10$^{-19}$ Coulombs), and the doping level $N_A$ reflects the density of acceptor impurities for the P-type semiconducting substrate 505. In general, the effective drain-source current $I_D$ may be a complicated function of various variables that themselves may be functions of various other variables, and so forth: $I_{D,eff}=f(V_T, L_{eff}, \ldots)$ and $I_{D,eff}=f(V_T,L_{eff}, \ldots)=f(V_T,L_{eff}(\text{gateCD}, \text{spacerwidth}, \ldots), \ldots)$.

Figure 6:
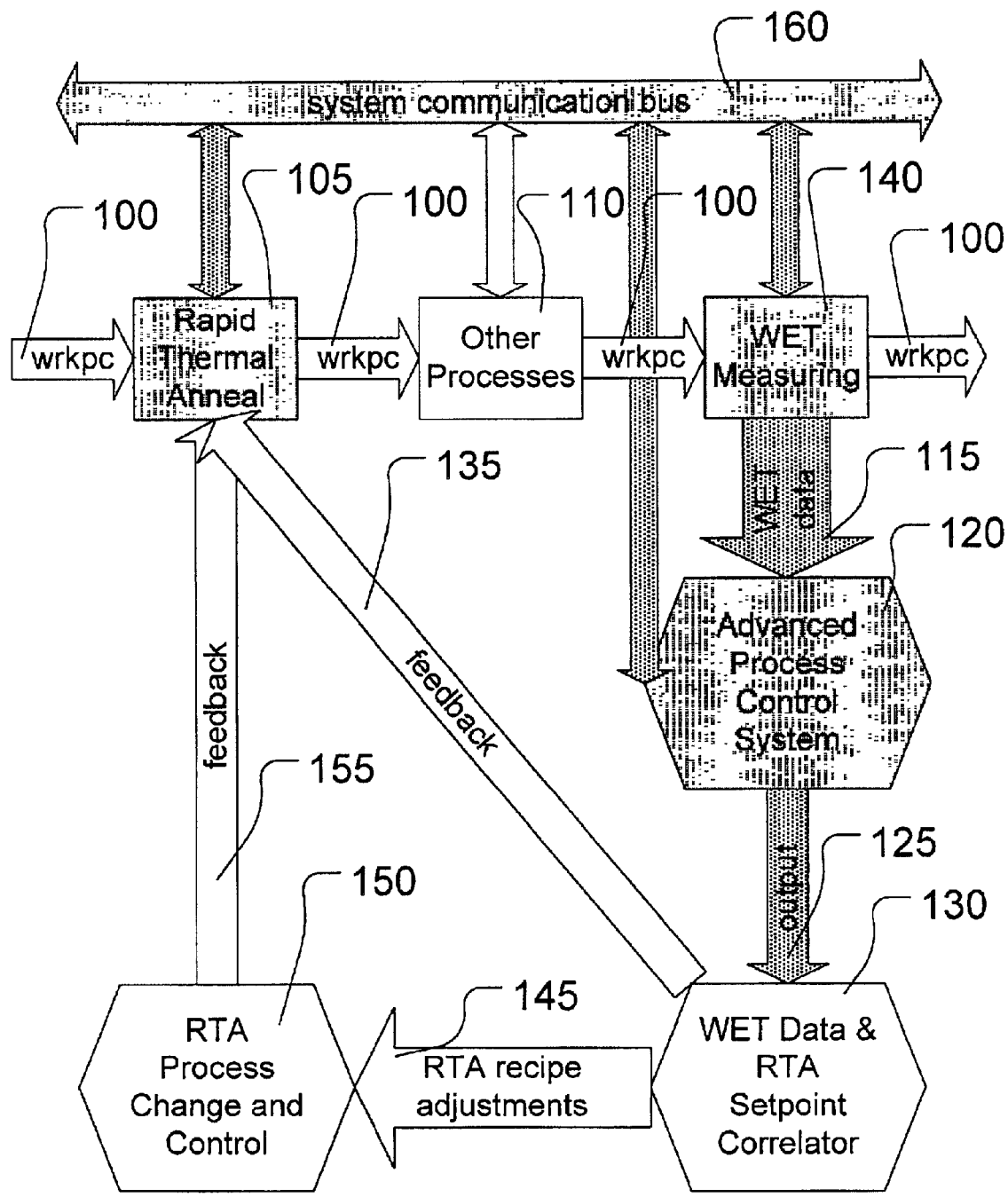

As shown in FIG. 6, the wafer electrical test (WET) data 115 is sent from the final Wafer Electrical Test (WET) measurement step 140 and delivered to the Advanced Process Control (APC) system 120. As shown in FIG. 6, the Advanced Process Control (APC) system 120 may communicate with the rapid thermal processing step 105 and the final Wafer Electrical Test (WET) measurement step 140 via the system communications bus 160. Delivering the wafer electrical test (WET) data 115 to the Advanced Process Control (APC) system 120 produces an output signal 125.

Figure 7:
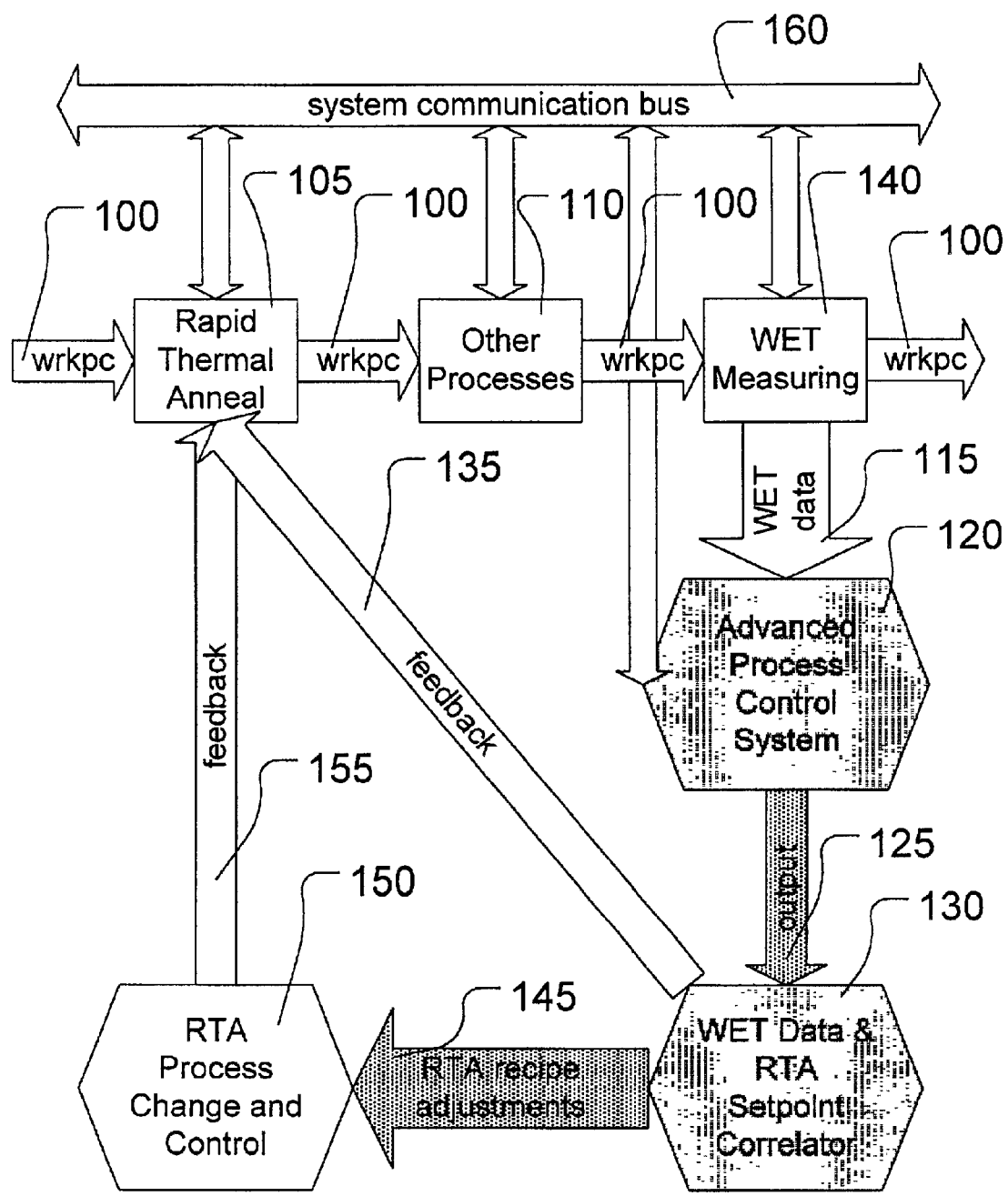

As shown in FIG. 7, the output signal 125 is sent from the Advanced Process Control (APC) system 120 and delivered to a wafer electrical test (WET) data and rapid thermal processing setpoint correlator 130. In the wafer electrical test (WET) data and rapid thermal processing setpoint correlator 130, the wafer electrical test (WET) data 115 is correlated with the rapid thermal processing (such as a rapid thermal anneal or RTA) performed in the rapid thermal processing step 105. The wafer electrical test (WET) data 115 may be correlated with the rapid thermal processing performed in the rapid thermal processing step 105 by using a wafer electrical test (WET) correlation model. For example, the measurement value of test resistors is inversely related to the rapid thermal anneal (RTA) temperature. Therefore, the rapid thermal anneal (RTA) temperature can be determined from the resistance value measured in the wafer electrical test (WET). The correlation(s) of the wafer electrical test (WET) data 115 with the rapid thermal processing performed in the rapid thermal processing step 105 produces one or more rapid thermal anneal (RTA) recipe adjustments 145.

The correlation(s) by the wafer electrical test (WET) data and rapid thermal processing setpoint correlator 130, of the wafer electrical test (WET) data 115 with the rapid thermal processing performed in the rapid thermal processing step 105, may be used to alert an engineer of the need to adjust the processing performed any of the processing steps (such as the rapid thermal processing step 105 and/or the other processing steps 110). The engineer may also alter and/or adjust, for example, the setpoints for the rapid thermal processing performed in the rapid thermal processing step 105.

Figure 8:
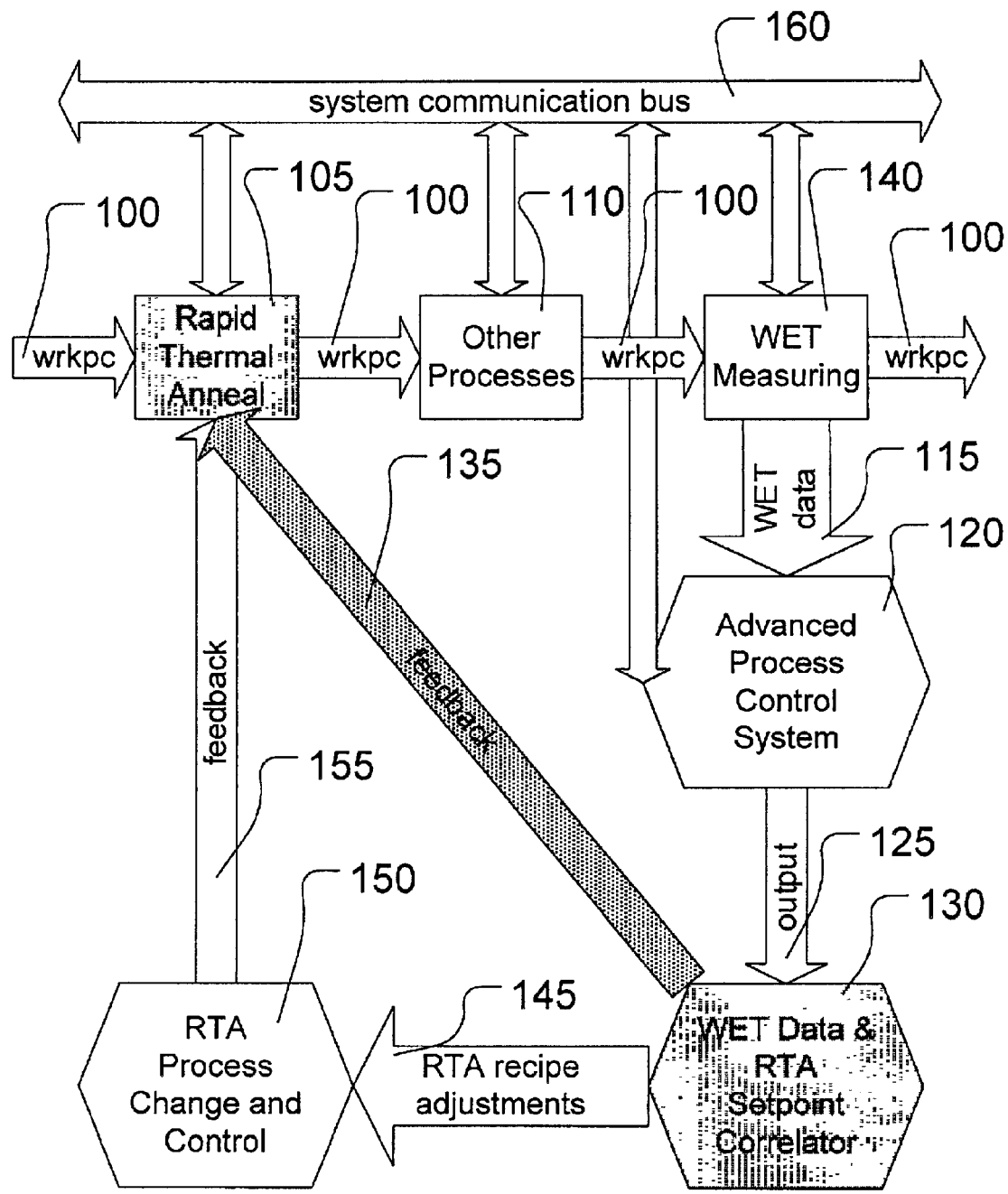

As shown in FIG. 8, a feedback control signal 135 may be sent from the wafer electrical test (WET) data and rapid thermal processing setpoint correlator 130 to the rapid thermal processing step 105 to adjust the rapid thermal processing performed in the rapid thermal processing step 105. In various alternative illustrative embodiments (not shown), the feedback control signal 135 may be sent from the wafer electrical test (WET) data and rapid thermal processing setpoint correlator 130 to any of the other processing steps 110 to adjust the processing performed in any of the other processing steps 110.

Figure 9:
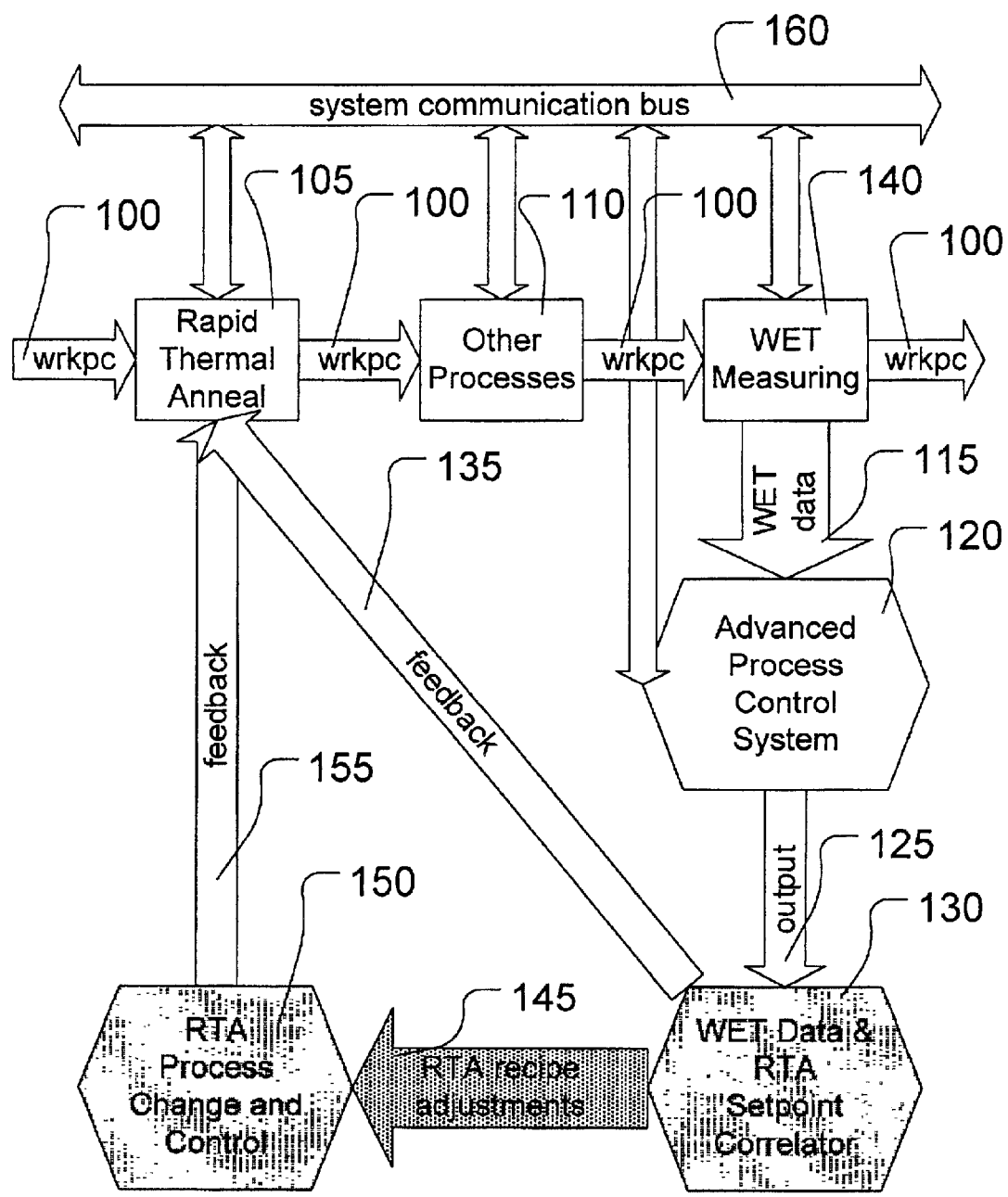
Figure 10:
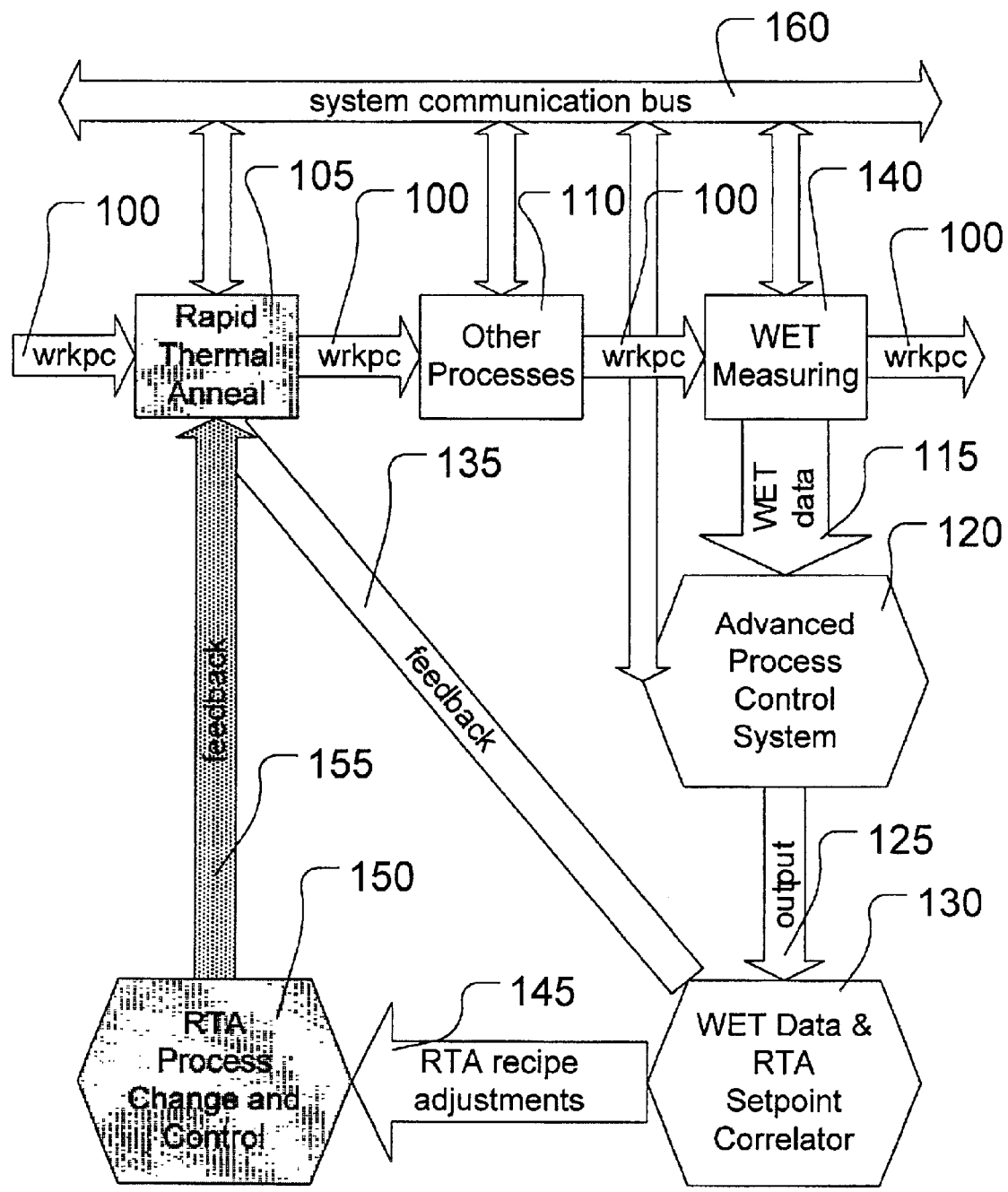

As shown in FIG. 9, in addition to, and/or instead of, the feedback control signal 135, the one or more rapid thermal anneal (RTA) recipe adjustments 145 may be sent from the wafer electrical test (WET) data and rapid thermal processing setpoint correlator 130 to a rapid thermal anneal (RTA) process change and control step 150. In the rapid thermal anneal (RTA) process change and control step 150, the one or more rapid thermal anneal (RTA) recipe adjustments 145 may be used in a high-level supervisory control loop. Thereafter, as shown in FIG. 10, a feedback control signal 155 may be sent from the rapid thermal anneal (RTA) process change and control step 150 to the rapid thermal processing step 105 to adjust the rapid thermal processing performed in the rapid thermal processing step 105. In various alternative illustrative embodiments (not shown), the feedback control signal 155 may be sent from the rapid thermal anneal (RTA) process change and control step 150 to any of the other processing steps 110 to adjust the processing performed in any of the other processing steps 110. In various illustrative embodiments, data signals from final Wafer Electrical Test (WET) measurements may be used to change setpoints at the rapid thermal processing step 105 in a supervisory manner such that subsequent production is driven closer to the final Wafer Electrical Test (WET) measurement target values.

The WET measurements, represented generally by a vector x, may be put into an MOS transistor model, represented generally by a function T(x), which maps the WET measurements x into a set of parameters, represented generally by a vector y, characteristic of the processing performed in at least one of the processing steps j 105, where j may have any value from j=1 to j=N, so that T(x)=y. The transistor model may be inverted, represented generally by a function $T^{-1}(y)=x$, which maps the characteristic processing parameters y into the WET measurements x.

For example, one illustrative embodiment of an MOS transistor model function T(x) gives the minimum channel length $L_{min}$ (related to the doped-poly gate 510 width w) for which long-channel subthreshold behavior can be observed. In this illustrative embodiment, the MOS transistor model function T(x) gives the minimum channel length $L_{min}$ by the simple empirical relation: $L_{min}=0.4[d_j t_{ox}(W_S+W_D)^2]^{1/3}$, measured in μm, where the junction depth $d_j$ is measured in μm, the gate oxide 515 thickness $t_{ox}$ is the numerical value of the number of Angstrom (Å) units (so the dimensions work out), and $(W_S+W_D)$ is the sum of the source and drain depletion depths, respectively, also measured in μm. In a one-dimensional abrupt junction formulation, the source depletion depth $W_S$ may be given by:

$$W_S = \sqrt{\frac{2\varepsilon_s}{qN_A}(V_{bi}+V_{BS})}$$

and the drain depletion depth $W_D$ may be given by:

$$W_D = \sqrt{\frac{2\varepsilon_s}{qN_A}(V_D+V_{bi}+V_{BS})},$$

where and $V_{bi}$ is the built-in voltage of the junction.

Another illustrative embodiment of an MOS transistor model function T(x) gives the minimum channel length $L_{min}$ by the more complicated empirical relation: $L_{min}=Af_1(\delta V_T/\delta V_D)[f_2(t_{ax})+B][f_3(W_S+W_D)+C][f_4(d_j)+D]$, where the functions $f_i$, for i=1,2,3,4, and the constants A, B, C, D, may be determined by fitting this equation for the minimum channel length $L_{min}$ to device simulations. For example, $f_1(\delta V_T/\delta V_D)=(\delta V_T/\delta V_D)^{-0.37}$, $f_2(t_{ax})=t_{ax}$, $f_3(W_S+W_D)=W_S+W_D$, $f_4(d_j)=d_j$, A=2.2 $\mu m^{-2}$, B=0.012 $\mu m$, C=0.15 $\mu m$, and D=2.9 $\mu m$ appear to give a good fit. In this illustrative embodiment, the inverted MOS transistor model function $T^{-1}(y)$ gives the variation $(\delta V_T/\delta V_D)$ of the threshold voltage $V_T$ with the drain voltage $V_D$, for example, by the more complicated empirical relation: $\delta V_T/\delta V_D=f_1^{-1}(L_{min}/\{A[f_2(t)+B][f_3(W_S+W_D)+C][f_4(d_j)+D]\})$. For the fit where $f_1(\delta V_T/\delta V_D)=(\delta V_T/\delta V_D)^{-0.37}$, $f_1^{-1}(y)=(y)^{-1/(0.37)}$, for example.

In various illustrative embodiments, the engineer may be provided with advanced process data monitoring capabilities, such as the ability to provide historical parametric data in a user-friendly format, as well as event logging, real-time graphical display of both current processing parameters and the processing parameters of the entire run, and remote, i.e., local site and worldwide, monitoring. These capabilities may engender more optimal control of critical processing parameters, such as throughput accuracy, stability and repeatability, processing temperatures, mechanical tool parameters, and the like. This more optimal control of critical processing parameters reduces this variability. This reduction in variability manifests itself as fewer within-run disparities, fewer run-to-run disparities and fewer tool-to-tool disparities. This reduction in the number of these disparities that can propagate means fewer deviations in product quality and performance. In such an illustrative embodiment of a method of manufacturing according to the present invention, a monitoring and diagnostics system may be provided that monitors this variability and optimizes control of critical parameters.

Figure 11:
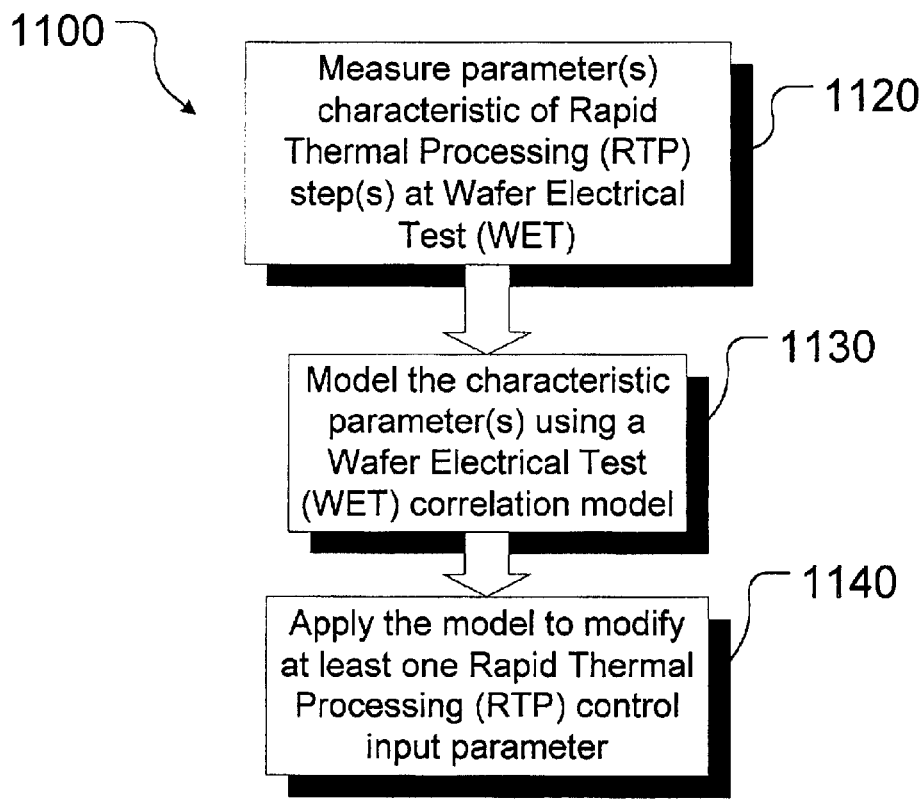
Figure 12:
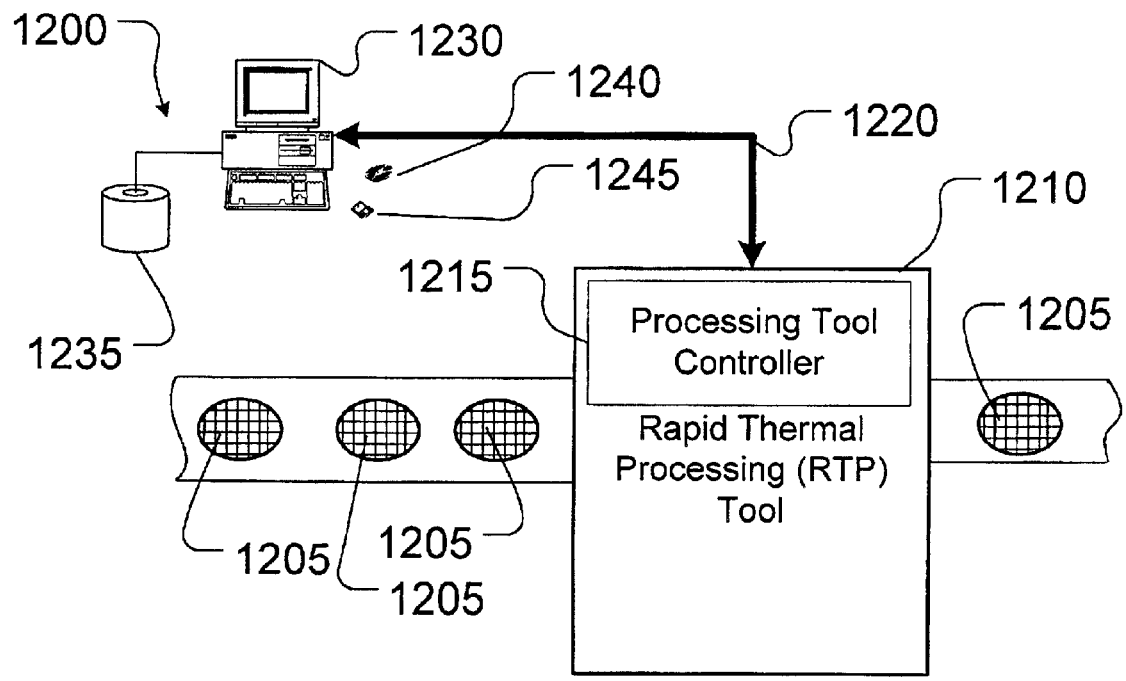

FIG. 11 illustrates one particular embodiment of a method 1100 practiced in accordance with the present invention. FIG. 12 illustrates one particular apparatus 1200 with which the method 1100 may be practiced. For the sake of clarity, and to further an understanding of the invention, the method 1100 shall be disclosed in the context of the apparatus 1200. However, the invention is not so limited and admits wide variation, as is discussed further below.

Referring now to both FIGS. 11 and 12, a batch or lot of workpieces or wafers 1205 is being processed through a Rapid Thermal Processing (RTP) tool 1210. The Rapid Thermal Processing (RTP) tool 1210 may be any Rapid Thermal Processing (RTP) tool known to the art, provided it comprises the requisite control capabilities. The Rapid Thermal Processing (RTP) tool 1210 comprises a Rapid Thermal Processing (RTP) tool controller 1215 for this purpose. The nature and function of the Rapid Thermal Processing (RTP) tool controller 1215 will be implementation specific.

For instance, the Rapid Thermal Processing (RTP) tool controller 1215 may control Rapid Thermal Processing (RTP) control input parameters such as Rapid Thermal Processing (RTP) recipe control input parameters and/or setpoints. As shown in FIG. 5, a metal-oxide-semiconductor (MOS) transistor 500 may be specified by several processing parameters. For example, the doped-poly gate 510 may have a width w that, in turn, determines a channel length L. The channel length L is the distance between the two metallurgical $N^-$-P ($P^-$-N) junctions formed below the gate oxide 515 for an N-MOS (P-MOS) transistor 500, the two metallurgical $N^-$-P ($P^-$-N) junctions being between the $N^-$-doped ($P^-$-doped) LDD regions 530 and the semiconducting substrate 505.

Furthermore, another junction (having a junction depth $d_j$) below the $N^+$-doped ($P^+$-doped) source/drain regions 520 may be formed between the $N^+$-doped ($P^+$-doped) source/drain regions 520 and the semiconducting substrate 505. The semiconducting substrate 505 may have a doping level $N_D$ ($N_A$) reflecting the density of donor (acceptor) impurities typically being given in numbers of ions per square centimeter for an N-type (P-type) semiconducting substrate 505. In addition, the $N^+$-doped ($P^+$-doped) source/drain regions 520 and the $N^-$-doped ($P^-$-doped) LDD regions 530 may each have respective doping levels $N_{D+}$ and $N_{D-}$ ($N_{A+}$ and $N_{A-}$). The respective doping levels may depend on dosages of ions implanted into the $N^+$-doped ($P^+$-doped) source/drain regions 520 and the $N^-$-doped ($P^-$-doped) LDD regions 530, the dosages typically being given in numbers of ions per square centimeter at ion implant energies typically given in keV. Further, the gate oxide 515 may have a thickness $t_{ax}$.

The Rapid Thermal Processing (RTP) control input parameters such as the Rapid Thermal Processing (RTP) recipe control input parameters and/or the setpoints may affect one or more of these metal-oxide-semiconductor (MOS) transistor 500 processing parameters. Four workpieces 1205 are shown in FIG. 12, but the lot of workpieces or wafers, i.e., the "wafer lot," may be any practicable number of wafers from one to any finite number.

The method 1100 begins, as set forth in box 1120, by measuring one or more parameters at the Wafer Electrical Test (WET) that are characteristic of the Rapid Thermal Processing (RTP) performed on the workpiece 1205 in the Rapid Thermal Processing (RTP) tool 1210. The nature, identity, and measurement of characteristic parameters at the Wafer Electrical Test (WET) will be largely implementation specific and even tool specific. For instance, capabilities for monitoring process parameters vary, to some degree, from tool to tool. Greater sensing capabilities may permit wider latitude in the characteristic parameters that are identified and measured and the manner in which this is done. Conversely, lesser sensing capabilities may restrict this latitude. For example, a junction depth $d_j$ may be inferred from measurements taken at the Wafer Electrical Test (WET). In turn, the Rapid Thermal Processing (RTP) control input parameters such as the Rapid Thermal Processing (RTP) recipe control input parameters and/or the setpoints for workpiece temperature and/or lamp power and/or anneal time and/or ramp rates and/or anneal recipes and/or the gas environment may directly affect the junction depth $d_j$. The junction depth $d_j$ inferred from measurements taken at the Wafer Electrical Test (WET) on the workpieces 1205 in a lot, is an illustrative example of a parameter characteristic of the Rapid Thermal Processing (RTP) performed on the workpiece in the Rapid Thermal Processing (RTP) tool 1210.

Turning to FIG. 12, in this particular embodiment, the Rapid Thermal Processing (RTP) process characteristic parameters are measured and/or monitored by tool sensors (not shown). The outputs of these tool sensors are transmitted to a computer system 1230 over a line 1220. The computer system 1230 analyzes these sensor outputs to identify the characteristic parameters.

Returning, to FIG. 11, once the characteristic parameter is identified and measured, the method 1100 proceeds by modeling the measured and identified characteristic parameter using a Wafer Electrical Test (WET) correlation model, as set forth in box 1130. For example, as described above, the measurement value of test resistors is inversely related to the rapid thermal anneal (RTA) temperature. Therefore, the rapid thermal anneal (RTA) temperature can be determined from the resistance value measured in the wafer electrical test (WET). The computer system 1230 in FIG. 12 is, in this particular embodiment, programmed to model the characteristic parameter. The manner in which this modeling occurs will be implementation specific.

In the embodiment of FIG. 12, a database 1235 stores a plurality of models that might potentially be applied, depending upon which characteristic parameter is measured. This particular embodiment, therefore, requires some a priori knowledge of the characteristic parameters that might be measured. The computer system 1230 then extracts an appropriate model from the database 1235 of potential models to apply to the measured characteristic parameters. If the database 1235 does not include an appropriate model, then the characteristic parameter may be ignored, or the computer system 1230 may attempt to develop one, if so programmed. The database 1235 may be stored on any kind of computer-readable, program storage medium, such as an optical disk 1240, a floppy disk 1245, or a hard disk drive (not shown) of the computer system 1230. The database 1235 may also be stored on a separate computer system (not shown) that interfaces with the computer system 1230.

Modeling of the measured characteristic parameter may be implemented differently in alternative embodiments. For instance, the computer system 1230 may be programmed using some form of artificial intelligence to analyze the sensor outputs and controller inputs to develop a model on-the-fly in a real-time implementation. This approach might be a useful adjunct to the embodiment illustrated in FIG. 12, and discussed above, where characteristic parameters are measured and identified for which the database 1235 has no appropriate model.

The method 1100 of FIG. 11 then proceeds by applying the model to modify at least one Rapid Thermal Processing (RTP) control input parameter, as set forth in box 1140. Depending on the implementation, applying the model may yield either a new value for a Rapid Thermal Processing (RTP) control input parameter or a correction to an existing Rapid Thermal Processing (RTP) control input parameter. The new Rapid Thermal Processing (RTP) control input is then formulated from the value yielded by the model and is transmitted to the Rapid Thermal Processing (RTP) tool controller 1215 over the line 1220. The Rapid Thermal Processing (RTP) tool controller 1215 then controls subsequent Rapid Thermal Processing (RTP) process operations in accordance with the new Rapid Thermal Processing (RTP) control inputs.

Some alternative embodiments may employ a form of feedback to improve the modeling of characteristic parameters. The implementation of this feedback is dependent on several disparate facts, including the tool's sensing capabilities and economics. One technique for doing this would be to monitor at least one effect of the model's implementation and update the model based on the effect(s) monitored. The update may also depend on the model. For instance, a linear model may require a different update than would a non-linear model, all other factors being the same.

As is evident from the discussion above, some features of the present invention are implemented in software. For instance, the acts set forth in the boxes 1120–1140 in FIG. 11 are, in the illustrated embodiment, software-implemented, in whole or in part. Thus, some features of the present invention are implemented as instructions encoded on a computer-readable, program storage medium. The program storage medium may be of any type suitable to the particular implementation. However, the program storage medium will typically be magnetic, such as the floppy disk 1245 or the computer 1230 hard disk drive (not shown), or optical, such as the optical disk 1240. When these instructions are executed by a computer, they perform the disclosed functions. The computer may be a desktop computer, such as the computer 1230. However, the computer might alternatively be a processor embedded in the Rapid Thermal Processing (RTP) tool 1210. The computer might also be a laptop, a workstation, or a mainframe in various other embodiments. The scope of the invention is not limited by the type or nature of the program storage medium or computer with which embodiments of the invention might be implemented.

Thus, some portions of the detailed descriptions herein are, or may be, presented in terms of algorithms, functions, techniques, and/or processes. These terms enable those skilled in the art most effectively to convey the substance of their work to others skilled in the art. These terms are here, and are generally, conceived to be a self-consistent sequence of steps leading to a desired result. The steps are those requiring physical manipulations of physical quantities. Usually, though not necessarily, these quantities take the form of electromagnetic signals capable of being stored, transferred, combined, compared, and otherwise manipulated.

It has proven convenient at times, principally for reasons of common usage, to refer to these signals as bits, values, elements, symbols, characters, terms, numbers, and the like. All of these and similar terms are to be associated with the appropriate physical quantities and are merely convenient labels applied to these quantities and actions. Unless specifically stated otherwise, or as may be apparent from the discussion, terms such as "processing," "computing," "calculating," "determining," "displaying," and the like, used herein refer to the action(s) and processes of a computer system, or similar electronic and/or mechanical computing device, that manipulates and transforms data, represented as physical (electromagnetic) quantities within the computer system's registers and/or memories, into other data similarly represented as physical quantities within the computer system's memories and/or registers and/or other such information storage, transmission and/or display devices.

Figure 13:
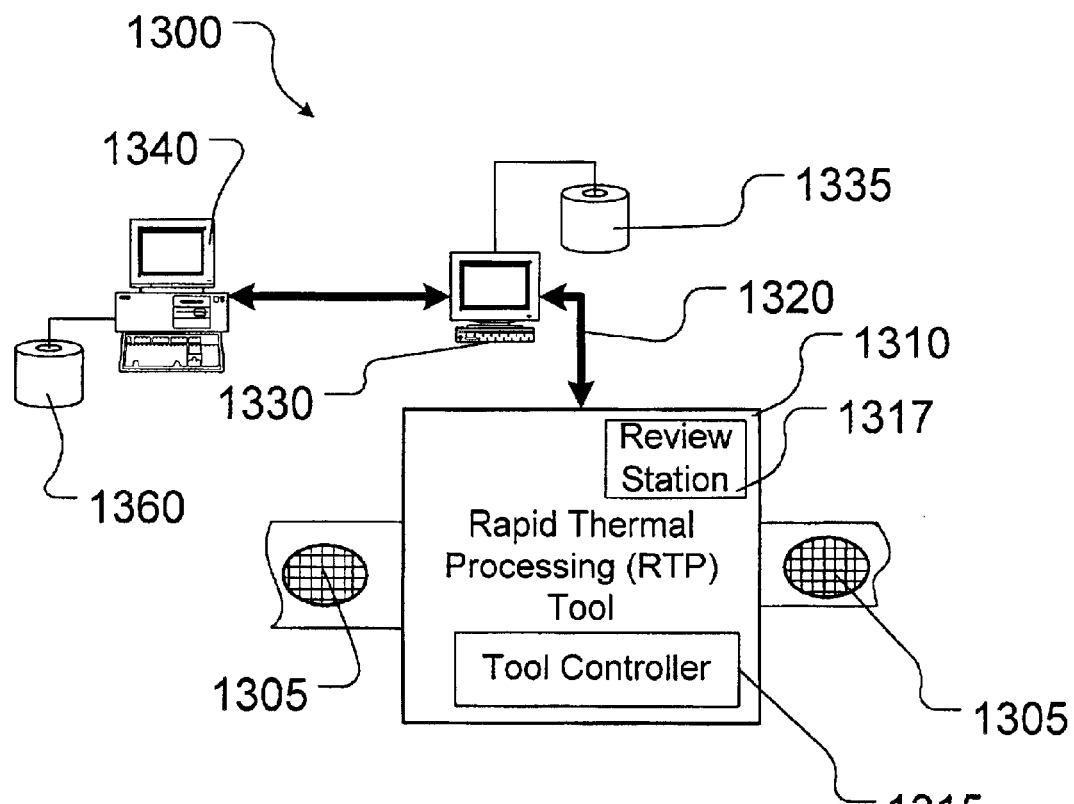
Figure 14:
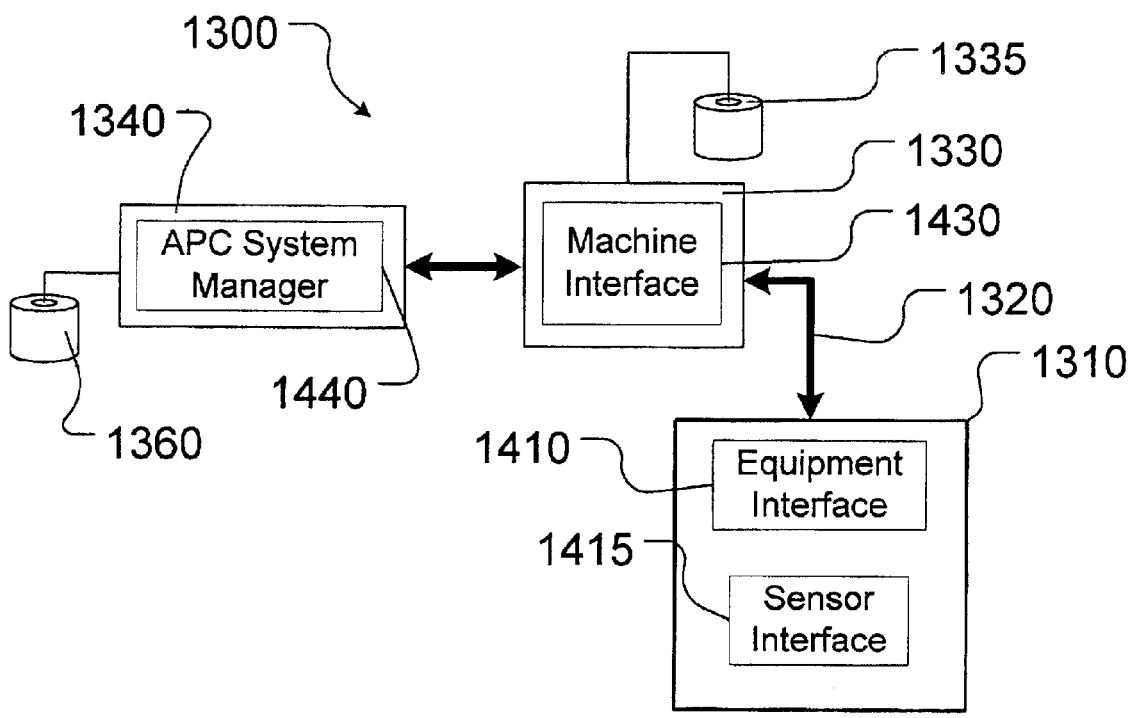

Construction of an Illustrative Apparatus. An exemplary embodiment 1300 of the apparatus 1200 in FIG. 12 is illustrated in FIGS. 13–14, in which the apparatus 1300 comprises a portion of an Advanced Process Control ("APC") system. FIGS. 13–14 are conceptualized, structural and functional block diagrams, respectively, of the apparatus 1300. A set of processing steps is performed on a lot of workpieces 1305 on a Rapid Thermal Processing (RTP) tool 1310. Because the apparatus 1300 is part of an Advanced Process Control (APC) system, the workpieces 1305 are processed on a run-to-run basis. Thus, process adjustments are made and held constant for the duration of a run, based on run-level measurements or averages. A "run" may be a lot, a batch of lots, or even an individual wafer.

In this particular embodiment, the workpieces 1305 are processed by the Rapid Thermal Processing (RTP) tool 1310 and various operations in the process are controlled by a plurality of Rapid Thermal Processing (RTP) control input signals on a line 1320 between the Rapid Thermal Processing (RTP) tool 1310 and a workstation 1330. Exemplary Rapid Thermal Processing (RTP) control inputs for this embodiment might include those for the setpoints for workpiece temperature, lamp power, anneal time, ramp rates, anneal recipes, process gas environment, and the like.

When a process step in the Rapid Thermal Processing (RTP) tool 1310 is concluded, the semiconductor workpieces 1305 being processed in the Rapid Thermal Processing (RTP) tool 1310 are examined eventually at a final Wafer Electrical Test (WET). The Rapid Thermal Processing (RTP) control inputs generally affect the characteristic parameters of the semiconductor workpieces 1305 measured at the final Wafer Electrical Test (WET), and, hence, the variability and properties of the acts performed by the Rapid Thermal Processing (RTP) tool 1310 on the workpieces 1305. Once errors are determined from the examination after the run of a lot of workpieces 1305, the Rapid Thermal Processing (RTP) control inputs on the line 1320 are modified for a subsequent run of a lot of workpieces 1305. Modifying the control signals on the line 1320 is designed to improve the next processing performed by the Rapid Thermal Processing (RTP) tool 1310. The modification is performed in accordance with one particular embodiment of the method 1100 set forth in FIG. 11, as described more fully below. Once the relevant Rapid Thermal Processing (RTP) control input signals for the Rapid Thermal Processing (RTP) tool 1310 are updated, the Rapid Thermal Processing (RTP) control input signals with new settings are used for a subsequent run of semiconductor devices.

Referring now to both FIGS. 13 and 14, the Rapid Thermal Processing (RTP) tool 1310 communicates with a manufacturing framework comprising a network of processing modules. One such module is an Advanced Process Control (APC) system manager 1440 resident on the computer 1340. This network of processing modules constitutes the Advanced Process Control (APC) system. The Rapid Thermal Processing (RTP) tool 1310 generally comprises an equipment interface 1410 and a sensor interface 1415. A machine interface 1430 resides on the workstation 1330. The machine interface 1430 bridges the gap between the Advanced Process Control (APC) framework, e.g., the Advanced Process Control (APC) system manager 1440, and the equipment interface 1410. Thus, the machine interface 1430 interfaces the Rapid Thermal Processing (RTP) tool 1310 with the Advanced Process Control (APC) framework and supports machine setup, activation, monitoring, and data collection. The sensor interface 1415 provides the appropriate interface environment to communicate with external sensors such as LabView® or other sensor bus-based data acquisition software. Both the machine interface 1430 and the sensor interface 1415 use a set of functionalities (such as a communication standard) to collect data to be used. The equipment interface 1410 and the sensor interface 1415 communicate over the line 1320 with the machine interface 1430 resident on the workstation 1330.

More particularly, the machine interface 1430 receives commands, status events, and collected data from the equipment interface 1410 and forwards these as needed to other Advanced Process Control (APC) components and event channels. In turn, responses from Advanced Process Control (APC) components are received by the machine interface 1430 and rerouted to the equipment interface 1410. The machine interface 1430 also reformats and restructures messages and data as necessary. The machine interface 1430 supports the startup/shutdown procedures within the Advanced Process Control (APC) System Manager 1440. It also serves as an Advanced Process Control (APC) data collector, buffering data collected by the equipment interface 1410, and emitting appropriate data collection signals.

In the particular embodiment illustrated, the Advanced Process Control (APC) system is a factory-wide software system, but this is not necessary to the practice of the invention. The control strategies taught by the present invention can be applied to virtually any semiconductor Rapid Thermal Processing (RTP) tool on a factory floor. Indeed, the present invention may be simultaneously employed on multiple Rapid Thermal Processing (RTP) tools in the same factory or in the same fabrication process. The Advanced Process Control (APC) framework permits remote access and monitoring of the process performance. Furthermore, by utilizing the Advanced Process Control (APC) framework, data storage can be more convenient, more flexible, and less expensive than data storage on local drives. However, the present invention may be employed, in some alternative embodiments, on local drives.

The illustrated embodiment deploys the present invention onto the Advanced Process Control (APC) framework utilizing a number of software components. In addition to components within the Advanced Process Control (APC) framework, a computer script is written for each of the semiconductor Rapid Thermal Processing (RTP) tools involved in the control system. When a semiconductor Rapid Thermal Processing (RTP) tool in the control system is started in the semiconductor manufacturing fab, the semiconductor Rapid Thermal Processing (RTP) tool generally calls upon a script to initiate the action that is required by the Rapid Thermal Processing (RTP) tool controller. The control methods are generally defined and performed using these scripts. The development of these scripts can comprise a significant portion of the development of a control system.

In this particular embodiment, there are several separate software scripts that perform the tasks involved in controlling the Rapid Thermal Processing (RTP) operation. There is one script for the Rapid Thermal Processing (RTP) tool 1310, including the review station 1317 and the Rapid Thermal Processing (RTP) tool controller 1315. There is also a script to handle the actual data capture from the review station 1317 and another script that contains common procedures that can be referenced by any of the other scripts. There is also a script for the Advanced Process Control (APC) system manager 1440. The precise number of scripts, however, is implementation specific and alternative embodiments may use other numbers of scripts.

Figure 15:
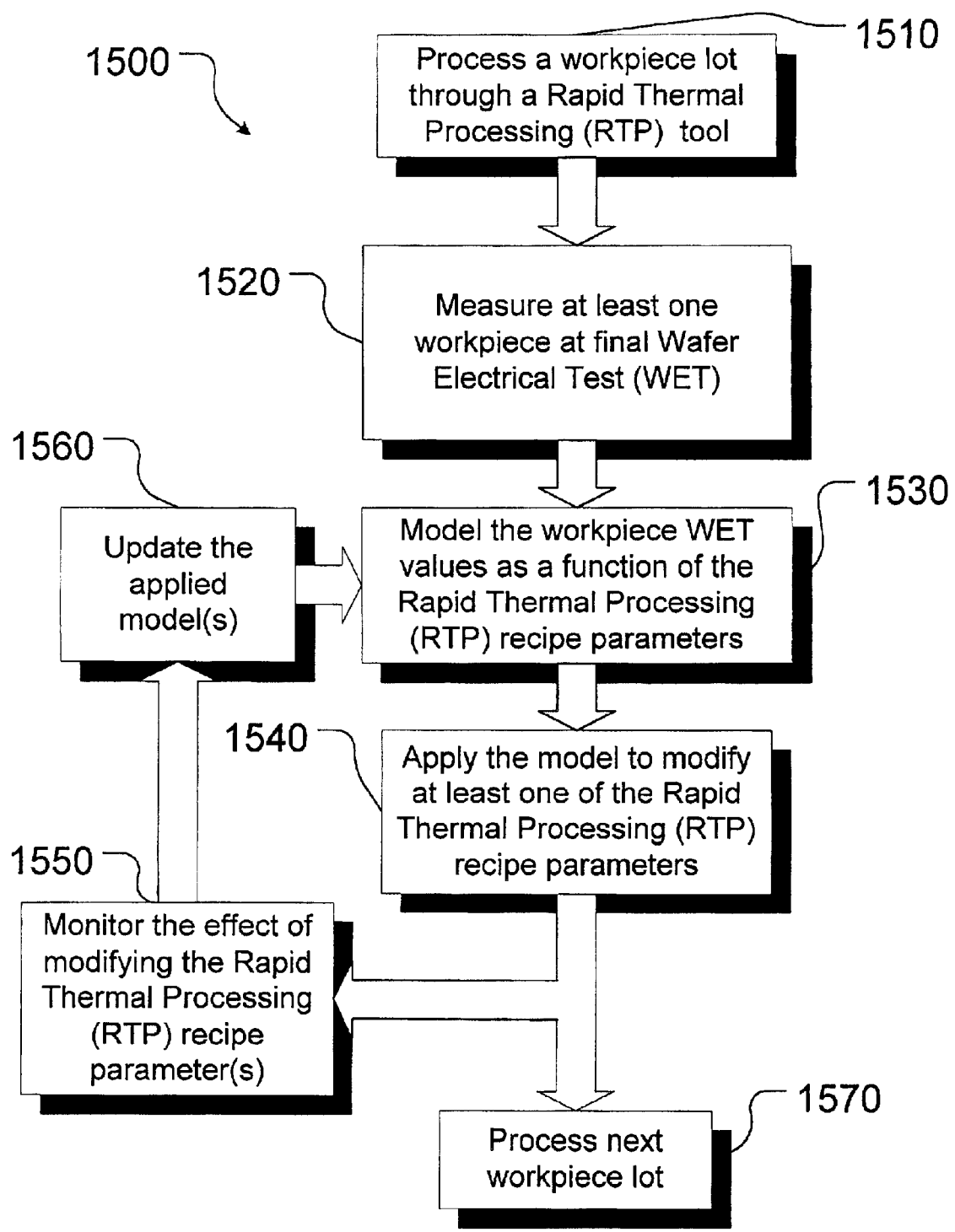

Operation of an Illustrative Apparatus. FIG. 15 illustrates one particular embodiment 1500 of the method 1100 in FIG. 11. The method 1500 may be practiced with the apparatus 1300 illustrated in FIGS. 13–14, but the invention is not so limited. The method 1500 may be practiced with any apparatus that may perform the functions set forth in FIG. 15. Furthermore, the method 1100 in FIG. 11 may be practiced in embodiments alternative to the method 1500 in FIG. 15.

Referring now to all of FIGS. 13–15, the method 1500 begins with processing a lot of workpieces 1305 through a Rapid Thermal Processing (RTP) tool, such as the Rapid Thermal Processing (RTP) tool 1310, as set forth in box 1510. In this particular embodiment, the Rapid Thermal Processing (RTP) tool 1310 has been initialized for processing by the Advanced Process Control (APC) system manager 1440 through the machine interface 1430 and the equipment interface 1410. In this particular embodiment, before the Rapid Thermal Processing (RTP) tool 1310 is run, the Advanced Process Control (APC) system manager script is called to initialize the Rapid Thermal Processing (RTP) tool 1310. At this step, the script records the identification number of the Rapid Thermal Processing (RTP) tool 1310 and the lot number of the workpieces 1305. The identification number is then stored against the lot number in a data store 1360. The rest of the script, such as the APCData call and the Setup and StartMachine calls, are formulated with blank or dummy data in order to force the machine to use default settings.

As part of this initialization, the initial setpoints for Rapid Thermal Processing (RTP) control are provided to the Rapid Thermal Processing (RTP) tool controller 1315 over the line 1320. These initial setpoints may be determined and implemented in any suitable manner known to the art. In the particular embodiment illustrated, Rapid Thermal Processing (RTP) controls are implemented by control threads. Each control thread acts like a separate controller and is differentiated by various process conditions. For Rapid Thermal Processing (RTP) control, the control threads are separated by a combination of different conditions. These conditions may include, for example, the semiconductor Rapid Thermal Processing (RTP) tool 1310 currently processing the wafer lot, the semiconductor product, the semiconductor manufacturing operation, and one or more of the semiconductor processing tools (not shown) that previously processed the semiconductor wafer lot.

Control threads are separated because different process conditions affect Rapid Thermal Processing (RTP) error(s) differently. A Rapid Thermal Processing (RTP) error may be defined as a difference between a measured parameter value and a predicted or expected value for that parameter derived from a model for the process concerned. A significant difference between the measured parameter value and the predicted or expected value for that parameter may signal a processing error condition. By isolating each of the process conditions into its own corresponding control thread, the Rapid Thermal Processing (RTP) error(s) can form a more accurate portrayal of the conditions in which a subsequent semiconductor wafer lot in the control thread will be processed. Since the error measurement is more relevant, changes to the Rapid Thermal Processing (RTP) control input signals based upon the error will be more appropriate.

The control thread for the Rapid Thermal Processing (RTP) control scheme depends upon the current Rapid Thermal Processing (RTP) tool, current operation, the product code for the current lot, and the identification number at a previous processing step. The first three parameters are generally found in the context information that is passed to the script from the Rapid Thermal Processing (RTP) tool 1310. The fourth parameter is generally stored when the lot is previously processed. Once all four parameters are defined, they are combined to form the control thread name; RTPP02_OPER01_PROD01_RTPP01 is an example of a control thread name. The control thread name is also stored in correspondence to the wafer lot number in the data store 1360.

Once the lot is associated with a control thread name, the initial settings for that control thread are generally retrieved from the data store 1360. There are at least two possibilities when the call is made for the information. One possibility is that there are no settings stored under the current control thread name. This can happen when the control thread is new, or if the information was lost or deleted. In these cases, the script initializes the control thread assuming that there is no error associated with it and uses the target values of the Rapid Thermal Processing (RTP) as the Rapid Thermal Processing (RTP) control input settings. It is preferred that the controllers use the default machine settings as the initial settings. By assuming some settings, Rapid Thermal Processing (RTP) errors can be related back to the control settings to facilitate feedback control.

Another possibility is that the initial settings are stored under the control thread name. In this case, one or more wafer lots have been processed under the same control thread name as the current wafer lot, and have also been measured for Rapid Thermal Processing (RTP) error using the final Wafer Electrical Test (WET). When this information exists, the Rapid Thermal Processing (RTP) control input signal settings are retrieved from the data store 1360. These settings are then downloaded to the Rapid Thermal Processing (RTP) tool 1310.

The workpieces 1305 are processed through the Rapid Thermal Processing (RTP) tool 1310. This comprises, in the embodiment illustrated, subjecting the workpieces 1305 to a rapid thermal anneal. The workpieces 1305 are measured on the review station 1317 after their Rapid Thermal Processing (RTP) on the Rapid Thermal Processing (RTP) tool 1310. The review station 1317 examines the workpieces 1305 after they are processed for a number of errors. The data generated by the instruments of the review station 1317 is passed to the machine interface 1430 via sensor interface 1415 and the line 1320. The review station script begins with a number of Advanced Process Control (APC) commands for the collection of data. The review station script then locks itself in place and activates a data available script. This script facilitates the actual transfer of the data from the review station 1317 to the Advanced Process Control (APC) framework. Once the transfer is completed, the script exits and unlocks the review station script. The interaction with the review station 1317 is then generally complete.

As will be appreciated by those skilled in the art having the benefit of this disclosure, the data generated by the review station 1317 should be preprocessed for use. Review stations, such as KLA review stations, provide the control algorithms for measuring the control error. Each of the error measurements, in this particular embodiment, corresponds to one of the Rapid Thermal Processing (RTP) control input signals on the line 1320 in a direct manner. Before the error can be utilized to correct the Rapid Thermal Processing (RTP) control input signal, a certain amount of preprocessing is generally completed.

For example, preprocessing may include outlier rejection. Outlier rejection is a gross error check ensuring that the received data is reasonable in light of the historical performance of the process. This procedure involves comparing each of the Rapid Thermal Processing (RTP) errors to its corresponding predetermined boundary parameter. In one embodiment, even if one of the predetermined boundaries is exceeded, the error data from the entire semiconductor wafer lot is generally rejected.

To determine the limits of the outlier rejection, thousands of actual semiconductor manufacturing fabrication ("fab") data points are collected. The standard deviation for each error parameter in this collection of data is then calculated. In one embodiment, for outlier rejection, nine times the standard deviation (both positive and negative) is generally chosen as the predetermined boundary. This was done primarily to ensure that only the points that are significantly outside the normal operating conditions of the process are rejected.

Preprocessing may also smooth the data, which is also known as filtering. Filtering is important because the error measurements are subject to a certain amount of randomness, such that the error significantly deviates in value. Filtering the review station data results in a more accurate assessment of the error in the Rapid Thermal Processing (RTP) control input signal settings. In one embodiment, the Rapid Thermal Processing (RTP) control scheme utilizes a filtering procedure known as an Exponentially-Weighted Moving Average ("EWMA") filter, although other filtering procedures can be utilized in this context.

One embodiment for the EWMA filter is represented by Equation (1):

$$AVG_N = W*M_C + (1-W)*AVG_P \quad (1)$$

where
$AVG_N$≡the new EWMA average;
W≡a weight for the new average ($AVG_N$);
$M_C$≡the current measurement; and
$AVG_P$≡the previous EWMA average.

The weight is an adjustable parameter that can be used to control the amount of filtering and is generally between zero and one. The weight represents the confidence in the accuracy of the current data point. If the measurement is considered accurate, the weight should be close to one. If there were a significant amount of fluctuations in the process, then a number closer to zero would be appropriate.

In one embodiment, there are at least two techniques for utilizing the EWMA filtering process. The first technique uses the previous average, the weight, and the current measurement as described above. Among the advantages of utilizing the first implementation are ease of use and minimal data storage. One of the disadvantages of utilizing the first implementation is that this method generally does not retain much process information. Furthermore, the previous average calculated in this manner would be made up of every data point that preceded it, which may be undesirable. The second technique retains only some of the data and calculates the average from the raw data each time.

The manufacturing environment in the semiconductor manufacturing fab presents some unique challenges. The order that the semiconductor wafer lots are processed through an Rapid Thermal Processing (RTP) tool may not correspond to the order in which they are read on the review station. This could lead to the data points being added to the EWMA average out of sequence. Semiconductor wafer lots may be analyzed more than once to verify the error measurements. With no data retention, both readings would contribute to the EWMA average, which may be an undesirable characteristic. Furthermore, some of the control threads may have low volume, which may cause the previous average to be outdated such that it may not be able to accurately represent the error in the Rapid Thermal Processing (RTP) control input signal settings.

The Rapid Thermal Processing (RTP) tool controller 1315, in this particular embodiment, uses limited storage of data to calculate the EWMA filtered error, i.e., the first technique. Wafer lot data, including the lot number, the time the lot was processed, and the multiple error estimates, are stored in the data store 1360 under the control thread name. When a new set of data is collected, the stack of data is retrieved from data store 1360 and analyzed. The lot number of the current lot being processed is compared to those in the stack. If the lot number matches any of the data present there, the error measurements are replaced. Otherwise, the data point is added to the current stack in chronological order, according to the time periods when the lots were processed. In one embodiment, any data point within the stack that is over 128 hours old is removed. Once the aforementioned steps are complete, the new filter average is calculated and stored to data store 1360.

Thus, the data is collected and preprocessed, and then processed to generate an estimate of the current errors in the Rapid Thermal Processing (RTP) control input signal settings. First, the data is passed to a compiled Matlab® plug-in that performs the outlier rejection criteria described above. The inputs to a plug-in interface are the multiple error measurements and an array containing boundary values. The return from the plug-in interface is a single toggle variable. A nonzero return denotes that it has failed the rejection criteria, otherwise the variable returns the default value of zero and the script continues to process.

After the outlier rejection is completed, the data is passed to the EWMA filtering procedure. The controller data for the control thread name associated with the lot is retrieved, and all of the relevant operation upon the stack of lot data is carried out. This comprises replacing redundant data or removing older data. Once the data stack is adequately prepared, it is parsed into ascending time-ordered arrays that correspond to the error values. These arrays are fed into the EWMA plug-in along with an array of the parameter required for its execution. In one embodiment, the return from the plug-in is comprised of the six filtered error values.

Returning to FIG. 15, data preprocessing comprises measuring workpiece 1305 WET values in a final WET measurement step, as set forth in box 1520. Known, potential characteristic parameters may be identified by characteristic data patterns or may be identified as known consequences of modifications to Rapid Thermal Processing (RTP) control. As an example that falls into this latter category, as described above the junction depth $d_j$ may be inferred from measurements taken at the Wafer Electrical Test (WET). In turn, the Rapid Thermal Processing (RTP) control input parameters such as the Rapid Thermal Processing (RTP) recipe control input parameters and/or the setpoints for workpiece temperature and/or lamp power and/or anneal time and/or ramp rates and/or anneal recipes and/or the gas environment may directly affect the junction depth $d_j$.

The next step in the control process is to calculate the new settings for the Rapid Thermal Processing (RTP) tool controller 1315 of the Rapid Thermal Processing (RTP) tool 1310. The previous settings for the control thread corresponding to the current wafer lot are retrieved from the data store 1360. This data is paired along with the current set of Rapid Thermal Processing (RTP) errors. The new settings are calculated by calling a compiled Matlab® plug-in. This application incorporates a number of inputs, performs calculations in a separate execution component, and returns a number of outputs to the main script. Generally, the inputs of the Matlab® plug-in are the Rapid Thermal Processing (RTP) control input signal settings, the review station 1317 errors, the final Wafer Electrical Test (WET) measurements taken on previous lots, an array of parameters that are necessary for the control algorithm, and a currently unused flag error. The outputs of the Matlab® plug-in are the new controller settings, calculated in the plug-in according to the controller algorithm described above.

A Rapid Thermal Processing (RTP) process engineer or a control engineer, who generally determines the actual form and extent of the control action, can set the parameters. They include the threshold values, maximum step sizes, controller weights, and target values. Once the new parameter settings are calculated, the script stores the setting in the data store 1360 such that the Rapid Thermal Processing (RTP) tool 1310 can retrieve them for the next wafer lot to be processed. The principles taught by the present invention can be implemented into other types of manufacturing frameworks.

Returning again to FIG. 15, the calculation of new settings comprises, as set forth in box 1530, modeling the workpiece 1305 Wafer Electrical Test (WET) values as a function of the Rapid Thermal Processing (RTP) recipe parameters. This modeling may be performed by the Matlab® plug-in. In this particular embodiment, only known, potential characteristic parameters are modeled and the models are stored in a database 1335 accessed by a machine interface 1430. The database 1335 may reside on the workstation 1330, as shown, or some other part of the Advanced Process Control (APC) framework. For instance, the models might be stored in the data store 1360 managed by the Advanced Process Control (APC) system manager 1440 in alternative embodiments. The model will generally be a mathematical model, i.e., an equation describing how the change(s) in Rapid Thermal Processing (RTP) recipe control (s) affects the Rapid Thermal Processing (RTP) performance and the Wafer Electrical Test (WET) measurements in the final Wafer Electrical Test (WET), and the like. The models described in various illustrative embodiments given above are examples of such models. For example, as described above, the measurement value of test resistors is inversely related to the rapid thermal anneal (RTA) temperature. Therefore, the rapid thermal anneal (RTA) temperature can be determined from the resistance value measured in the wafer electrical test (WET).

The particular model used will be implementation specific, depending upon the particular Rapid Thermal Processing (RTP) tool 1310 and the particular characteristic parameter being modeled. Whether the relationship in the model is linear or non-linear will be dependent on the particular parameters involved.

The new settings are then transmitted to and applied by the Rapid Thermal Processing (RTP) tool controller 1315. Thus, returning now to FIG. 15, once the workpiece 1305 Wafer Electrical Test (WET) values are modeled, the model is applied to modify at least one Rapid Thermal Processing (RTP) recipe control input parameter, as set forth in box 1540. In this particular embodiment, the machine interface 1430 retrieves the model from the database 1335, plugs in the respective value(s), and determines the necessary change (s) in the Rapid Thermal Processing (RTP) recipe control input parameter(s). The change is then communicated by the machine interface 1430 to the equipment interface 1410 over the line 1320. The equipment interface 1410 then implements the change.

The present embodiment furthermore provides that the models be updated. This comprises, as set forth in boxes 1550–1560 of FIG. 15, monitoring at least one effect of modifying the Rapid Thermal Processing (RTP) recipe control input parameters (box 1550) and updating the applied model (box 1560) based on the effect(s) monitored. For instance, various aspects of the operation of the Rapid Thermal Processing (RTP) tool 1310 will change as the Rapid Thermal Processing (RTP) tool 1310 ages. By monitoring the effect of the Rapid Thermal Processing (RTP) recipe change(s) implemented as a result of the characteristic parameter measurement, the necessary value could be updated to yield superior performance.

As noted above, this particular embodiment implements an Advanced Process Control (APC) system. Thus, changes are implemented "between" workpiece lots. The actions set forth in the boxes 1520–1560 are implemented after the current workpiece lot is processed and before the second workpiece lot is processed, as set forth in box 1570 of FIG. 15. However, the invention is not so limited. For example, in alternative illustrative embodiments, changes may be implemented "between" individual workpieces. Furthermore, as noted above, a lot may constitute any practicable number of wafers from one to several thousand (or practically any finite number). What constitutes a "lot" is implementation specific, and so the point of the fabrication process in which the updates occur will vary from implementation to implementation.

Any of the above-disclosed embodiments of a method according to the present invention enables the use of central values and spreads of parametric measurements sent from measuring tools and/or a wafer electrical test (WET) to make supervisory processing adjustments, either manually and/or automatically, to improve and/or better control the yield. Additionally, any of the above-disclosed embodiments of a method of manufacturing according to the present invention enables semiconductor device fabrication with increased device accuracy and precision, increased efficiency and increased device yield, enabling a streamlined and simplified process flow, thereby decreasing the complexity and lowering the costs of the manufacturing process and increasing throughput.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   measuring at least one characteristic parameter relating to a rapid thermal processing step performed on a workpiece;
   modeling the at least one characteristic parameter measured using a correlation model; and
   applying the correlation model to modify the processing performed in the processing step.

2. The method of claim 1, wherein measuring the at least one characteristic parameter of the processing performed on the workpiece in the processing step comprises measuring the at least one characteristic parameter at a wafer electrical test (WET).

3. The method of claim 1, wherein measuring the at least one characteristic parameter of the processing performed on the workpiece in the processing step comprises measuring the at least one characteristic parameter of rapid thermal processing performed on the workpiece in a rapid thermal processing step.

4. The method of claim 2, wherein measuring the at least one characteristic parameter of the processing performed on the workpiece in the processing step comprises measuring the at least one characteristic parameter of rapid thermal processing performed on the workpiece in a rapid thermal processing step.

5. The method of claim 1, wherein modeling the at least one characteristic parameter measured using the correlation model comprises modeling the at least one characteristic parameter measured using a wafer electrical test (WET) correlation model.

6. The method of claim 2, wherein modeling the at least one characteristic parameter measured using the correlation model comprises modeling the at least one characteristic parameter measured using a wafer electrical test (WET) correlation model.

7. The method of claim 3, wherein modeling the at least one characteristic parameter measured using the correlation model comprises modeling the at least one characteristic parameter measured using a wafer electrical test (WET) correlation model.

8. The method of claim 5, wherein applying the wafer electrical test (WET) correlation model to modify the processing performed in the processing step comprises applying the wafer electrical test (WET) correlation model to modify rapid thermal processing performed on the workpiece in a rapid thermal processing step.

9. The method of claim 6, wherein applying the wafer electrical test (WET) correlation model to modify the processing performed in the processing step comprises applying the wafer electrical test (WET) correlation model to modify rapid thermal processing performed on the workpiece in a rapid thermal processing step.

10. The method of claim 7, wherein applying the wafer electrical test (WET) correlation model to modify the processing performed in the processing step comprises applying the wafer electrical test (WET) correlation model to modify the rapid thermal processing performed on the workpiece in the rapid thermal processing step.

11. A computer-readable, program storage device, encoded with instructions that, when executed by a computer, perform a method comprising:
   measuring at least one characteristic parameter relating to a rapid thermal processing step performed on a workpiece;
   modeling the at least one characteristic parameter measured using correlation model; and
   applying the correlation model to modify the processing performed in the processing step.

12. The device of claim 11, wherein measuring the at least one characteristic parameter of the processing performed on the workpiece in the processing step comprises measuring the at least one characteristic parameter at a wafer electrical test (WET).

13. The device of claim 11, wherein measuring the at least one characteristic parameter of the processing performed on the workpiece in the processing step comprises measuring the at least one characteristic parameter of rapid thermal processing performed on the workpiece in a rapid thermal processing step.

14. The device of claim 12, wherein measuring the at least one characteristic parameter of the processing performed on the workpiece in the processing step comprises measuring the at least one characteristic parameter of rapid thermal processing performed on the workpiece in a rapid thermal processing step.

15. The device of claim 11, wherein modeling the at least one characteristic parameter measured using the correlation model comprises modeling the at least one characteristic parameter measured using a wafer electrical test (WET) correlation model.

16. The device of claim 12, wherein modeling the at least one characteristic parameter measured using the correlation model comprises modeling the at least one characteristic parameter measured using a wafer electrical test (WET) correlation model.

17. The device of claim 13, wherein modeling the at least one characteristic parameter measured using the correlation model comprises modeling the at least one characteristic parameter measured using a wafer electrical test (WET) correlation model.

18. The device of claim 15, wherein applying the wafer electrical test (WET) correlation model to modify the processing performed in the processing step comprises applying the wafer electrical test (WET) correlation model to modify rapid thermal processing performed on the workpiece in a rapid thermal processing step.

19. The device of claim 16, wherein applying the wafer electrical test (WET) correlation model to modify the processing performed in the processing step comprises applying the wafer electrical test (WET) correlation model to modify rapid thermal processing performed on the workpiece in a rapid thermal processing step.

20. The device of claim 17, wherein applying the wafer electrical test (WET) correlation model to modify the processing performed in the processing step comprises applying the wafer electrical test (WET) correlation model to modify the rapid thermal processing performed on the workpiece in the rapid thermal processing step.

21. A computer programmed to perform a method comprising:
   measuring at least one characteristic parameter relating to a rapid thermal processing step performed on a workpiece;
   modeling the at least one characteristic parameter measured using a correlation model; and
   applying the correlation model to modify the processing performed in the processing step.

22. The computer of claim 21, wherein measuring the at least one characteristic parameter of the processing performed on the workpiece in the processing step comprises measuring the at least one characteristic parameter at a wafer electrical test (WET).

23. The computer of claim 21, wherein measuring the at least one characteristic parameter of the processing performed on the workpiece in the processing step comprises measuring the at least one characteristic parameter of rapid thermal processing performed on the workpiece in a rapid thermal processing step.

24. The computer of claim 22, wherein measuring the at least one characteristic parameter of the processing performed on the workpiece in the processing step comprises measuring the at least one characteristic parameter of rapid thermal processing performed on the workpiece in a rapid thermal processing step.

25. The computer of claim 21, wherein modeling the at least one characteristic parameter measured using the correlation model comprises modeling the at least one characteristic parameter measured using a wafer electrical test (WET) correlation model.

26. The computer of claim 22, wherein modeling the at least one characteristic parameter measured using the correlation model comprises modeling the at least one characteristic parameter measured using a wafer electrical test (WET) correlation model.

27. The computer of claim 23, wherein modeling the at least one characteristic parameter measured using the correlation model comprises modeling the at least one characteristic parameter measured using a wafer electrical test (WET) correlation model.

28. The computer of claim 25, wherein applying the wafer electrical test (WET) correlation model to modify the processing performed in the processing step comprises applying the wafer electrical test (WET) correlation model to modify rapid thermal processing performed on the workpiece in a rapid thermal processing step.

29. The computer of claim 26, wherein applying the wafer electrical test (WET) correlation model to modify the processing performed in the processing step comprises applying the wafer electrical test (WET) correlation model to modify rapid thermal processing performed on the workpiece in a rapid thermal processing step.

30. The computer of claim 27, wherein applying the wafer electrical test (WET) correlation model to modify the processing performed in the processing step comprises applying the wafer electrical test (WET) correlation model to modify the rapid thermal processing performed on the workpiece in the rapid thermal processing step.

31. An apparatus, comprising:

a controller for controlling a processing to perform a rapid thermal process upon a first workpiece and for controlling a measurement device to perform an electrical test upon said first workpiece to measure a characteristic parameter, said controller to model said characteristic parameter measured using a correlation model and apply said correlation model to modify said rapid thermal process performed on a second workpiece.

32. The apparatus of claim 31, wherein said workpiece is a semiconductor wafer.

33. A system, comprising:

a processing tool to perform a rapid thermal process upon a first workpiece and a second workpiece;

a measurement device to perform a wafer electrical test upon said first and second workpieces to measure a characteristic parameter relating to processing of said first workpiece; and a controller for controlling said processing tool and said measurement device, said controller to model said characteristic parameter measured using a correlation model and apply said correlation model to modify said rapid thermal process performed on a second workpiece.

34. The system of claim 33, wherein said workpiece is a semiconductor wafer.

35. A method, comprising:

measuring at least one electrical characteristic parameter relating to a rapid thermal process performed on a first workpiece;

modeling the at least one characteristic parameter measured using a correlation model; and applying the correlation model to modify said rapid thermal process performed on a second workpiece.

* * * * *